United States Patent
Murata et al.

(10) Patent No.: US 8,895,960 B2
(45) Date of Patent: Nov. 25, 2014

(54) ELECTRODE COVERING MATERIAL, ELECTRODE STRUCTURE AND SEMICONDUCTOR DEVICE

(75) Inventors: Masaki Murata, Tokyo (JP); Nobuhide Yoneya, Kanagawa (JP); Norio Kimura, Tokyo (JP)

(73) Assignee: Sony Corporation, Tokyo (JP)

(*) Notice: Subject to any disclaimer, the term of this patent is extended or adjusted under 35 U.S.C. 154(b) by 1250 days.

(21) Appl. No.: 12/515,585

(22) PCT Filed: Nov. 21, 2007

(86) PCT No.: PCT/JP2007/072581
§ 371 (c)(1), (2), (4) Date: Jul. 13, 2009

(87) PCT Pub. No.: WO2008/062843
PCT Pub. Date: May 29, 2008

(65) Prior Publication Data
US 2010/0314611 A1   Dec. 16, 2010

(30) Foreign Application Priority Data
Nov. 22, 2006   (JP) .................. 2006-315845

(51) Int. Cl.
| | |
|---|---|
| H01L 29/08 | (2006.01) |
| H01L 51/00 | (2006.01) |
| H01L 51/10 | (2006.01) |
| H01L 51/05 | (2006.01) |

(52) U.S. Cl.
CPC ......... *H01L 51/0095* (2013.01); *H01L 51/0545* (2013.01); *H01L 51/0083* (2013.01); *H01L 51/0035* (2013.01); *H01L 51/0541* (2013.01); *H01L 51/105* (2013.01)
USPC .......................................................... 257/40

(58) Field of Classification Search
CPC ........ C09D 7/00; C07B 401/14; B32B 15/08; H01L 51/30
USPC ............ 257/40, E51.041; 428/419, 446, 458, 428/461; 546/257; 106/287.2
See application file for complete search history.

(56) References Cited

U.S. PATENT DOCUMENTS

| | | | | |
|---|---|---|---|---|
| 6,093,716 A | * | 7/2000 | Davis et al. ............... | 514/252.18 |
| 6,114,333 A | * | 9/2000 | Davis et al. ............... | 514/252.18 |

(Continued)

FOREIGN PATENT DOCUMENTS

| | | |
|---|---|---|
| JP | 10-270712 | 10/1998 |
| JP | 2000-261515 | 9/2000 |

(Continued)

OTHER PUBLICATIONS

Japanese Patent Office, Notification of reasons for refusal issued in connection with Japanese Patent Application No. 2006-315845, dated Aug. 21, 2012. (3 pages).

(Continued)

*Primary Examiner* — Caleb Henry
(74) *Attorney, Agent, or Firm* — K&L Gates LLP

(57) ABSTRACT

A semiconductor device is provided and includes a field effect transistor having a gate electrode, a gate insulating layer, a channel forming region composed of an organic semiconductor material layer and a source/drain electrode made of a metal. A portion of the source/drain electrode in contact with the organic semiconductor material layer comprising the channel forming region is covered with an electrode coating material. Because the electrode coating material is composed of organic molecules having a functional group which can be bound to a metal ion and a functional group that binds to the source/drain electrode composed of the metal, low contact resistance and high mobility can be achieved.

9 Claims, 4 Drawing Sheets

(56) References Cited

U.S. PATENT DOCUMENTS

| | | | | |
|---|---|---|---|---|
| 6,146,547 | A * | 11/2000 | Saito et al. | 252/299.61 |
| 6,552,029 | B1 * | 4/2003 | Davis et al. | 514/275 |
| 6,924,427 | B2 * | 8/2005 | Eckert et al. | 136/252 |
| 7,105,854 | B2 * | 9/2006 | Sirringhaus et al. | 257/40 |
| 7,151,275 | B2 * | 12/2006 | Klauk et al. | 257/40 |
| 7,521,525 | B2 * | 4/2009 | Sohn et al. | 528/423 |
| 7,572,974 | B2 * | 8/2009 | Chittibabu et al. | 136/263 |
| 7,629,606 | B2 * | 12/2009 | Matsui | 257/40 |
| 7,646,014 | B2 * | 1/2010 | Kim et al. | 257/40 |
| 7,816,671 | B2 * | 10/2010 | Park et al. | 257/40 |
| 7,872,254 | B2 * | 1/2011 | Suwa et al. | 257/40 |
| 2005/0133782 | A1 * | 6/2005 | Klauk et al. | 257/40 |
| 2005/0147847 | A1 * | 7/2005 | Nakamura | 428/690 |
| 2006/0054883 | A1 | 3/2006 | Hanna et al. | |
| 2006/0076556 | A1 * | 4/2006 | Hobara et al. | 257/40 |
| 2007/0063195 | A1 * | 3/2007 | Kim et al. | 257/40 |
| 2007/0194305 | A1 * | 8/2007 | Kim et al. | 257/40 |
| 2008/0067504 | A1 * | 3/2008 | Park et al. | 257/40 |
| 2008/0105866 | A1 * | 5/2008 | Jeong et al. | 257/40 |
| 2008/0108832 | A1 * | 5/2008 | Yabunouchi et al. | 549/59 |
| 2008/0191202 | A1 * | 8/2008 | Hobara | 257/40 |

FOREIGN PATENT DOCUMENTS

| | | |
|---|---|---|
| JP | 2004-288836 | 10/2004 |
| JP | 2005-011901 | 1/2005 |
| JP | 2006-100519 | 4/2006 |
| WO | 2006/019502 | 3/2006 |

OTHER PUBLICATIONS

International Search Report dated Jan. 29, 2008, for corresponding International Application No. PCT/JP2007/072581.
Kanaizuka, K. et al., "Electrochemical properties of bis (terpyridine) iron ( II ) complex oligomers prepared by the bottom-up method on gold electrode," The Electrochemical Society of Japan, p. 95, 2003.
European Search Report for Application No. 07832311.0/1235/ 2091077; PCT JP2007072581 dated Jul. 13, 2011.
Synthesis of a New Terpyridine Ligand Combined with Ruthenium(II) Complex and its Usage in the Stepwise Fabrication of Complex Polymer Wires on Gold; Ohba et al., Macromolecular Symposia, vol. 235, No. 1, Mar. 1, 2006, pp. 31-38, XP55001424, ISSN: 1022-1360, DOI: 10.1002/masy.200650305 *figures Schemes 4,5*.
Comparative electrochemistry and electrocatalytic activities of cobalt, iron and manganese phthalocyanine complexes axially co-ordinated to mercaptopyridine self-assembled monolayer at gold electrodes, Ozoemena et al.; Electrochimica Acta, Elsevier Science Publishers, Barking, GB, vol. 51, No. 13, Mar. 5, 2006, pp. 2669-2677, XP025167926, ISSN: 0013-4686, DOI: 10:1016/J. Electacta. 2005.08.007 *figure 1*.
Ultraviolet-visible and surface-enhanced Raman scattering spectroscopy studies on self-assembled films of ruthenium phthalocyanine on organic monolayer-modified silver substrates, Li et al., Thin Solid Films, Elsevier-Sequoia S.A. Lausanne, CH, vol. 457, No. 2, Jun. 15, 2004, pp. 372-380, XP004507240, ISSN: 0040-6090, DOI: 10:1016/ J. TSF.2003.11.298 *figure*.
Synthesis and Redox Behavior Biferrocenyl-Functionalized Ruthenium(II) Terpyridine Gold Clusters, Dong et al., Langmuir, vol. 20. No. 21, Oct. 1, 2004,pp. 9340-9347, XP55001430, ISSN: 0743-7463, DOI:10.1021/1a0489458 *figure Scheme 1*.
2,2':6',2"-Terpyridine-4'(1'H)-thione: a missing link in metal-lasupramolecular chemistry, Constable et al., New Journal of Chemistry, vol. 29, No. 11, Jan. 1, 2005, pp. 1475, XP55001454, ISSN: 1144-0546, DOI: 10.1039/b510792j *The whole document*.
Structure and Electrochemistry of 4,4'-Dithiodipyridine Self-Assembled Monolayers in Comparison with 4-Mercaptopyridine Self-Assembled Monolayers on Au(111), Zhou et al.. Langmuir, vol. 20., No. 11, May 1, 2004, pp. 4590-4595, XP55001451, ISSN: 0743-7463, DOI: 10.1021/1a049903m *the whole document*.
Japanese Patent Office, Notification of reasons for refusal issued in connection with Japanese Patent Application No. 2006-315845, dated Jun. 12, 2012. (3 pages).
Kosbar, et al. "Self-Assembled Multilayers of Transition-Metal-Terpyridinyl complexes; Formation, and Characterization," Langmuir, The ACS Journal of Surfaces and Colloids, vol. 22, Issue 18, Aug. 29, 2006, pp. 7631-7638. (8 pages).
European Patent Office, Communication pursuant to Article 94(3) EPC, issued in connection with European Patent Application No. 07 832 311.0, dated Mar. 8, 2012. (5 pages).
Korean Office Action issued Oct. 30, 2013 in corresponding Korean Patent Application No. 20097010423.

* cited by examiner

A)

B)

C)

A)

B)

A)

B)

ELECTRODE COVERING MATERIAL, ELECTRODE STRUCTURE AND SEMICONDUCTOR DEVICE

CROSS REFERENCE TO RELATED APPLICATIONS

The present application is a National Stage of International Application No. PCT/JP2007/072581 filed on Nov. 21, 2008 and which claims priority to Japanese Patent Application No. 2006-315845 filed on Nov. 22, 2006, the entire contents of which are being incorporated herein by reference.

BACKGROUND

This present disclosure relates to an electrode covering material, an electrode structure and a semiconductor device.

Where semiconductor devices are fabricated from conventional silicon semiconductor substrates and the like, a photolithographic technique and many thin film-forming techniques have been in use. However, these fabrication techniques are complicated and take a long time for the fabrication of semiconductor devices, thus presenting a serious obstacle to the reduction in fabrication costs of the semiconductor devices. Existing semiconductor devices are a so-called bulk, thus making it difficult to apply them to fields requiring flexibility and plasticity.

In order to provide an electronic device to be substituted for semiconductor devices based on such conventional silicon semiconductor substrate and the like, e.g. a field effect transistor (FET), intensive studies and developments of devices using conductive polymer materials have been in progress. As a result, a new field of flexible and inexpensive plastic electronics has now been being developed. And a so-called organic field effect transistor whose channel forming region is constituted of an organic semiconductor material layer is well known such as, for example, from Japanese Patent Laid-Open No. Hei 10-270712 and Japanese Patent Laid-Open No. 2000-269515.

In the techniques disclosed in these Japanese Laid-open Patent Applications, the organic semiconductor material layer forming the channel forming region is in direct contact with source/drain electrodes made of a metal. In such a structure as mentioned above, the transfer of electrons at the interface between a metal and the organic semiconductor material layer involves a considerable energy loss. More particularly, the transfer of electrons at the junction interface between the metal and the organic semiconductor material layer is greatly influenced by the metal interface wherein free electrons exist, the interface of the organic semiconductor material layer having a quantized space and the difference in distance and direction therebetween at the junction interface, thus being very inefficient under existing circumstances. As a consequence, problems are involved in the contact resistance being great and the mobility being low.

SUMMARY

Accordingly, an object of the present invention is to provide an electrode covering material capable of obtaining a low contact resistance value, an electrode structure, and a semiconductor device capable of achieving a low contact resistance and a high mobility.

The semiconductor devices according to first to fourth embodiments for achieving the above object comprises a field effect transistor including a gate electrode, a gate insulating layer, a channel forming region constituted of an organic semiconductor material layer, and source/drain electrodes made of a metal wherein the source/drain electrodes at portions thereof in contact with the organic semiconductor material layer serving as the channel forming region is covered with an electrode covering material. The electrode structures according to the first to fourth embodiments of the present invention for achieving the above object are composed of an electrode and an electrode covering material covering the surface of the electrode.

An electrode covering material according to the first embodiment for achieving the above object, an electrode covering material used in the semiconductor device according to the first embodiment, and an electrode covering material used in the electrode structure according to the first embodiment comprise organic molecules represented by the formula (1), wherein a functional group Y in the formula (1) is bound to a surface of an electrode (or source/drain electrodes) made of a metal.

An electrode covering material according to the second embodiment for achieving the above object, an electrode covering material used in the semiconductor device according to the second embodiment, and an electrode covering material used in the electrode structure according to the second embodiment comprise organic molecules represented by the formula (1), wherein a functional group Y in the formula (1) is bound to a surface of an electrode (or source/drain electrodes) made of a metal and at least one member selected from the group consisting of a nitrogen atom, a functional group $R_1$ and a functional group $R_2$ in the formula (1) binds to a metal ion to form a chelate.

More particularly, in the electrode covering material according to the second embodiment, the semiconductor device according to the second embodiment o and the electrode structure according to the second embodiment (all of which may be sometimes referred generically to as second embodiment), the nitrogen atom in the formula (1) binds to a metal ion to form a chelate, or the functional group $R_1$ in the formula (1) binds to a metal ion to form a chelate, or the functional group $R_2$ in the formula (1) binds to a metal ion to form a chelate, or the nitrogen atom and the functional group $R_1$ in the formula (1) bind to a metal ion to form a chelate, or the nitrogen atom and the functional group $R_2$ in the formula (1) bind to a metal ion to form a chelate, or the functional group $R_1$ and the functional group $R_2$ in the formula (1) bind to a metal ion to form a chelate, or the nitrogen atom, the functional group $R_1$ and the functional group $R_2$ in the formula (1) bind to a metal ion to form a chelate.

Further, an electrode covering material according to the third embodiment for achieving the above object, an electrode-covering material used in the semiconductor device according to the third embodiment and an electrode covering material used in the electrode structure according to the third embodiment comprise first organic molecules and second organic molecules, wherein the first organic molecules consist of organic molecules represented by the formula (1) and the second organic molecules consists of organic molecules represented by the formula (6), a functional group Y in the formula (1) binds to a surface of an electrode (or source/drain electrodes) made of a metal, at least one member selected from the group consisting of a nitrogen atom, a functional group $R_1$ and a functional group $R_2$ in the formula (1) binds to a metal ion to form a chelate, and at least one member selected from the group consisting of a functional group $R'_1$, a functional group $R'_2$ and nitrogen atom adjacent to the functional group $R'_1$ in the formula (6) binds to a metal ion to form a chelate and/or at least one member selected from the group consisting of a functional group $R'_3$, a functional group $R'_4$ and nitrogen atom adjacent to the functional group $R'_3$ in the formula (6) binds to a metal ion to form a chelate.

More particularly, in the electrode covering material according to the third embodiment, the semiconductor device according to the third embodiment and the electrode structure according to the third embodiment (all of which may be sometimes referred generically simply as third embodiment), the nitrogen atom in the formula (1) binds to a metal ion to form a chelate, or the functional group $R_1$ in the formula (1) binds to a metal ion to form a chelate, or the functional group $R_2$ in the formula (1) binds to a metal ion to form a chelate, or the nitrogen atom and the functional group $R_1$ in the formula (1) bind to a metal ion to form a chelate, or the nitrogen atom and the functional group $R_2$ in the formula (1) bind to a metal ion to form a chelate, or the functional group $R_1$ and the functional group $R_2$ in the formula (1) bind to a metal ion to form a chelate, or the nitrogen atom, the functional group $R_1$ and the functional group $R_2$ in the formula (1) bind to a metal ion to form a chelate, or the functional group $R'_1$ in the formula (6) binds to a metal ion to form a chelate, or the functional group $R'_2$ in the formula (6) binds to a metal ion to form a chelate, or the nitrogen atom adjacent to the functional group $R'_1$ in the formula (6) (hereinafter referred to as adjacent nitrogen atom A for convenience' sake) binds to a metal ion to form a chelate, or the functional group $R'_1$ and the functional group $R'_2$ in the formula (6) bind to a metal ion to form a chelate, or the functional group $R'_1$ and the adjacent nitrogen atom A in the formula (6) bind to a metal ion to form a chelate, or the functional group $R'_2$ and the adjacent nitrogen atom A in the formula (6) bind to a metal ion to form a chelate, or the functional group $R'_1$, the functional group $R'_2$ and the adjacent nitrogen atom A in the formula (6) bind to a metal ion to form a chelate, or additionally, the functional group $R'_3$ in the formula (6) binds to a metal ion to form a chelate, or the functional group $R'_4$ in the formula (6) binds to a metal ion to form a chelate, or the nitrogen atom adjacent to the functional group $R'_3$ in the formula (6) (hereinafter referred to as adjacent nitrogen atom B for convenience' sake) binds to a metal ion to form a chelate, or the functional group $R'_3$ and the functional group $R'_4$ in the formula (6) bind to a metal ion to form a chelate, or the functional group $R'_3$ and the adjacent nitrogen atom B in the formula (6) bind to a metal ion to form a chelate, or the functional group $R'_4$ and the adjacent nitrogen atom B in the formula (6) bind to a metal ion to form a chelate, or the functional group $R'_3$, the functional group $R'_4$ and the adjacent nitrogen atom B in the formula (6) bind to a metal ion to form a chelate.

It will be noted that because at least one member selected from the group consisting of the nitrogen atom, functional group $R_1$ and functional group $R_2$ in the formula (1) binds to a metal ion to form a chelate and this metal ion and at least one member selected from the functional group $R'_1$, functional group $R'_2$ and the nitrogen atom adjacent to the functional group in the formula (6) bind together to form a chelate, the first organic molecule and the second organic molecule are bound together. Further, at least one member selected from the group consisting of the functional group $R'_1$, functional group $R'_2$ and the nitrogen atom adjacent to the functional group $R'_1$ in the formula (6) binds to a metal ion to form a chelate and this metal ion and at least one member selected from the group consisting of the functional group $R'_3$, functional group $R'_4$, and the nitrogen atom adjacent to the functional group $R'_3$ in the formula (6) bind together to form a chelate, with the result that the second organic molecule and another second organic molecule are bound together thereby permitting the bound body of the second organic molecules to undergo elongation.

An electrode covering material according to the fourth embodiment for achieving the above object, an electrode covering material used in the semiconductor device according to the fourth embodiment, and an electrode covering material used in the electrode structure according to the fourth embodiment comprise organic molecules having a functional group capable of binding with a metal ion and a functional group binding to an electrode (or source/drain electrodes) made of a metal. It should be noted that in the electrode covering material according to the fourth embodiment of the present invention, the semiconductor device according to the fourth embodiment of the present invention or the electrode structure according to the fourth embodiment of the present invention (all of which may be generically referred to simply as fourth embodiment), the embodiment may be so arranged that a functional group capable of binding with a metal ion and the metal ion bind together to form a chelate, or a functional group capable of binding with a metal ion is made of pyridine or a derivative thereof, bipyridine or a derivative thereof or terpyridine or a derivative thereof and a functional group binding to an electrode (or source/drain electrodes) made of a metal may be constituted of a thiol group, or a carboxyl group, a cyano group, an isocyano group, a thiocyanato group, an amino group, a silanol group, a hydroxyl group, a pyridine, a thiophene or the like. Moreover, the functional group capable of binding with a metal ion includes a monodentate ligand, a bidentate ligand or a tri dentate ligand based on a nitrogen atom, a sulfur atom or an oxygen atom such as a pyridyl group, an oligopyridyl group, a thiophenyl group, a dithiolato group, an oxalato group or the like.

[Chemical Formula 1]

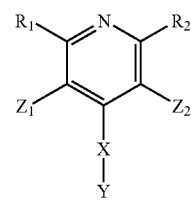

(1)

[Chemical Formula 2]

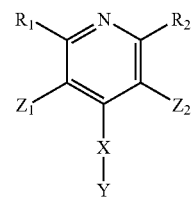

(1)

-continued (6)

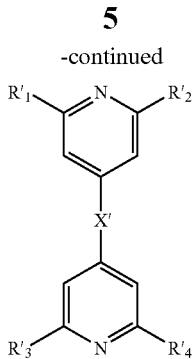

In this regard, however,
X in the formula (1) is any of the following formulas (2-1) to (2-10) or nil,
Y in the formula (1) is any of the following formulas (3-1) to (3-12),
$R_1$ in the formula (1) is any of the following formulas (4-1) to (4-19),
$R_2$ in the formula (1) is any of the following formulas (4-1) to (4-19),
$Z_1$ is any of the following formulas (5-1) to (5-18),
$Z_2$ is any of the following formulas (5-1) to (5-18),
$Z_3$ is any of the following formulas (5-1) to (5-18),
$Z_4$ is any of the following formulas (5-1) to (5-18),
$Z_5$ is any of the following formulas (5-1) to (5-18),
$Z_6$ is any of the following formulas (5-1) to (5-18),
X' in the formula (6) is any of the following formulas (7-1) to (7-13),
$R'_1$ in the formula (6) is any of the following formulas (8-1) to (8-19),
$R'_2$ in the formula (6) is any of the following formulas (8-1) to (8-19),
$R'_3$ in the formula (6) is any of the following formulas (8-1) to (8-19),
$R'_4$ in the formula (6) is any of the following formulas (8-1) to (8-19),
$Z'_1$ is any of the following formulas (9-1) to (9-18),
$Z'_2$ is any of the following formulas (9-1) to (9-18),
$Z'_3$ is any of the following formulas (9-1) to (9-18),
$Z'_4$ is any of the following formulas (9-1) to (9-18),
$Z'_5$ is any of the following formulas (9-1) to (9-18),
$Z'_6$ is any of the following formulas (9-1) to (9-18), and
n and m are integers of 1 or over.

[Chemical Formula 3]

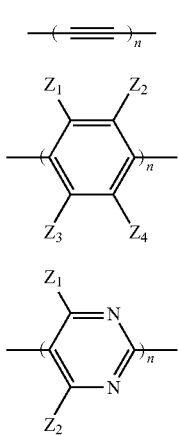

(2-1)

(2-2)

(2-3)

(2-4)

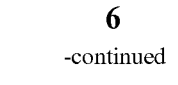

(2-5)

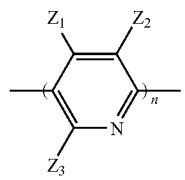

(2-6)

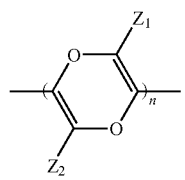

(2-7)

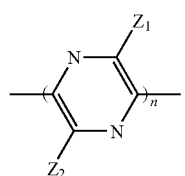

(2-8)

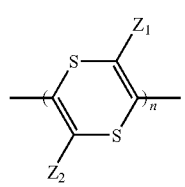

(2-9)

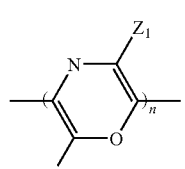

(2-10)

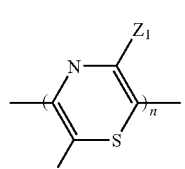

[Chemical Formula 4]

HS— (3-1)

HOOC— (3-2)

$H_2N$— (3-3)

HOSi— (3-4)

—S— (3-5)

NC— (3-6)

OCN— (3-7)

NCS— (3-8)

-continued
(3-9)
HO—
(3-10)
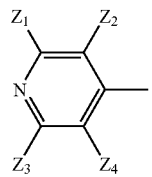
(3-11)
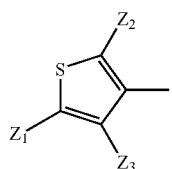
(3-12)
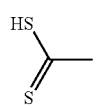
[Chemical Formula 5]
(4-1)
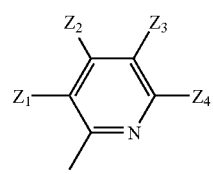
(4-2)
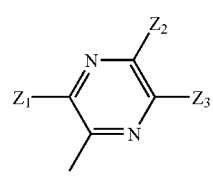
(4-3)
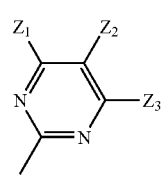
(4-4)
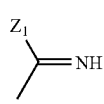
(4-5)
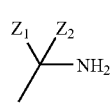
(4-6)
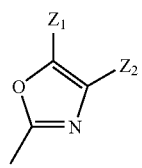
-continued
(4-7)
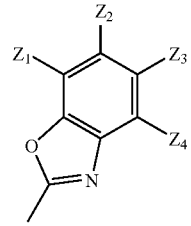
(4-8)
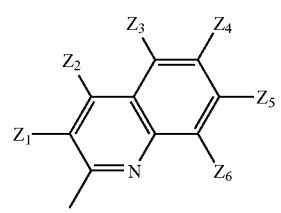
(4-9)
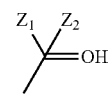
(4-10)
(4-11)
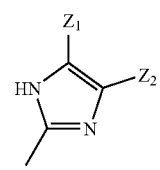
(4-12)
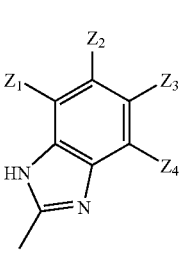
(4-13)
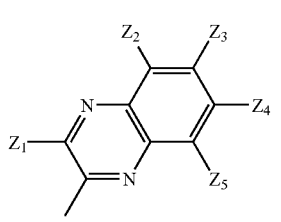
(4-14)
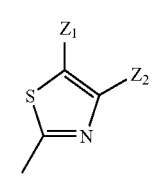

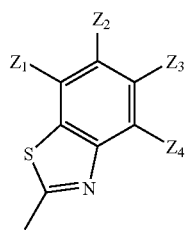 (4-15)
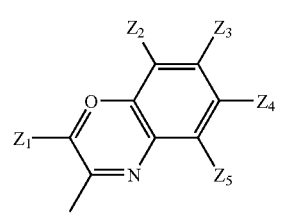 (4-16)
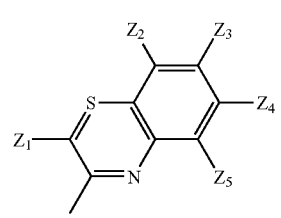 (4-17)
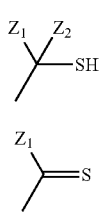 (4-18)
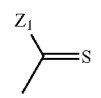 (4-19)
[Chemical Formula 6]
 (5-1)
 (5-2)
 (5-3)
 (5-4)
 (5-5)
 (5-6)
—(CH$_2$)$_m$CH$_3$ (5-7)
—OCH$_3$ (5-8)
—O(CH$_2$)$_m$CH$_3$ (5-9)
—COOH (5-10)
—(C=O)H (5-11)
—(C=O)CH$_3$ (5-12)
—(C=O)(CH$_2$)$_m$CH$_3$ (5-13)
—(C=O)OCH$_3$ (5-14)
—(C=O)O(CH$_2$)$_m$CH$_3$ (5-15)
—C$_6$H$_5$ (5-16)
—(C=O)C$_6$H$_5$ (5-17)
—(C=O)OC$_6$H$_5$ (5-18)
[Chemical Formula 7]
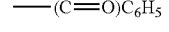 (7-1)
 (7-2)
—S—S— (7-3)
—[Si(Z′$_1$)(Z′$_2$)]$_n$— (7-4)
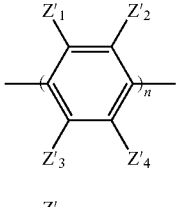 (7-5)
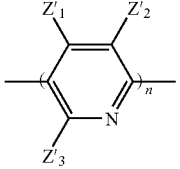 (7-6)
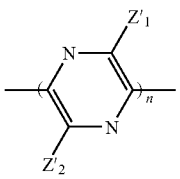 (7-7)
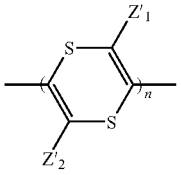 (7-8)
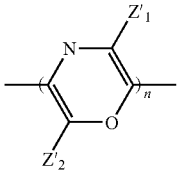 (7-9)
 (7-10)
 (7-11)

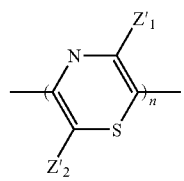 (7-12)
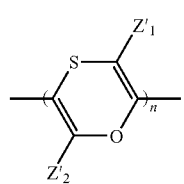 (7-13)
[Chemical Formula 8]
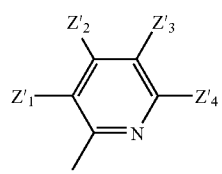 (8-1)
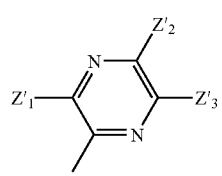 (8-2)
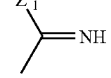 (8-3)
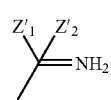 (8-4)
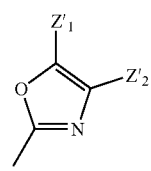 (8-5)
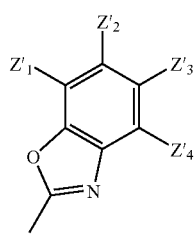 (8-6)
(8-7)
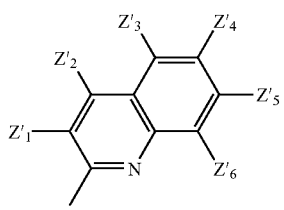 (8-8)
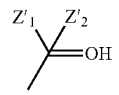 (8-9)
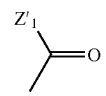 (8-10)
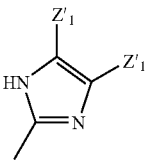 (8-11)
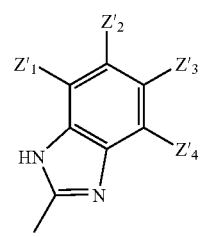 (8-12)
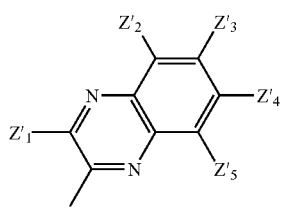 (8-13)
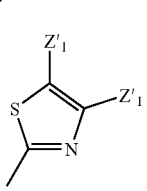 (8-14)
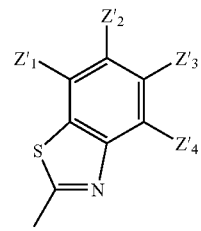 (8-15)
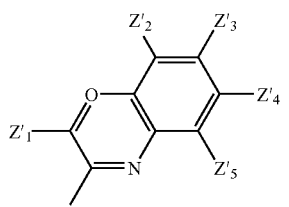 (8-16)

-continued

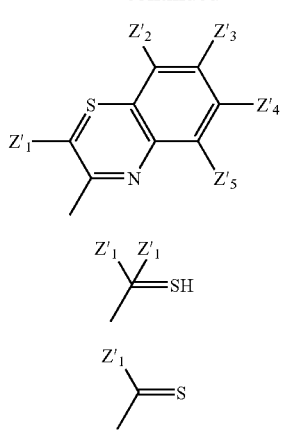
(8-17)

$$\underset{Z'_1}{\overset{Z'_1}{\diagdown}}{=}SH$$ (8-18)

$$\underset{Z'_1}{\diagdown}{=}S$$ (8-19)

[Chemical Formula 9]

——H (9-1)

——F (9-2)

——Cl (9-3)

——Br (9-4)

——I (9-5)

——$CH_3$ (9-6)

——$(CH_2)_m CH_3$ (9-7)

——$OCH_3$ (9-8)

——$O(CH_2)_m CH_3$ (9-9)

——COOH (9-10)

——(C=O)H (9-11)

——(C=O)$CH_3$ (9-12)

——(C=O)$(CH_2)_m CH_3$ (9-13)

——(C=O)$OCH_3$ (9-14)

——(C=O)$O(CH_2)_m CH_3$ (9-15)

——$C_6H_5$ (9-16)

——(C=O)$C_6H_5$ (9-17)

——(C=O)$OC_6H_5$ (9-18)

Alternatively, X in the formula (1) may have a molecular structure constituted of a π conjugated system or σ conjugated system and specific examples of the π conjugated system include carbon-based unsaturated groups such as a phenyl group, a vinyl group (an ethynyl group) and the like. The σ conjugated system includes a sulfide group, a disulfide group, a silyl group and the like. Additionally, a composite system of the π conjugated system and the σ conjugated system may also be used.

It will be noted that X in the formula (1) should not favorably have a degree of freedom other than rotation relative to the bound sites at opposite sides from the standpoint that organic molecules are provided as a rigid π conjugated structure.

In the second, third or fourth embodiments, a metal serving as a metal ion includes, from a wide aspect, alkali metals, alkaline earth metals, transition metals, rare-earth metals and the like, and specific examples include iron (Fe), cobalt (Co), copper (Cu), nickel (Ni), silver (Ag), platinum (Pt), palladium (Pd), ruthenium (Ru), titanium (Ti), zinc (Zn), magnesium (Mg), and manganese (Mn).

In the first to fourth embodiments, as a method of covering the surface of an electrode (or source/drain electrode) with the electrode-covering material, there can be mentioned a method wherein using the functional group Y having a substituent group such as, for example, a thiol group, which is able to bind to the surface of the electrode (or source/drain electrodes), a layer made of an electrode covering material is provided as a self-assembled monolayer is formed on the surface of the electrode (or source/drain electrode). Alternatively, there may be mentioned a method wherein after the bonding between the surface of the electrode (or source/drain electrode) and the functional group Y, a chelate is formed by immersion in a solution of metal ions.

In the embodiments, as a metal used for the electrode or source/drain electrode, mention is made of a metal such as gold (Au), silver (Ag), copper (Cu), palladium (Pd), platinum (Pt), chromium (Cr), nickel (Ni), aluminium (Al), tantalum (Ta), tungsten (W), titanium (Ti), indium (In), tin (Sn) or the like, or alloys containing these metal elements, conductive particles made of these metals, and conductive particles of alloys containing these metals. The source-drain electrode may be formed as a laminated structure including layers containing these elements. It will be noted that in the semiconductor devices according to the first to fourth embodiments of the present invention, materials for a gate electrode and a variety of wirings include, aside from these materials, conductive materials such as polysilicon containing impurities, organic materials (conductive polymers) such as poly(3,4-ethylenedioxythiophene)/polystyrenesulfonic acid [PEDOT/PSS], and carbon materials. Materials for the source/drain electrode, a gate electrode and a variety of wirings may be the same or different from one another.

As a method of forming the source/drain electrode, gate electrode and wirings, mention may be made of, although depending on the types of constituting materials therefor, a physical vapor deposition method (PVD method); various chemical vapor deposition methods (CVD methods) including an MOCVD method; a spin coating method; various printing methods including a screen printing method, an ink-jet method, an offset printing method, a gravure printing method and the like: various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a capillary coater method, a slid orifice coater method, a calender coater method, a dipping method and the like; a stamping method; a lift-off method; an etching method; a shadow mask method; plating methods such as an electroplating method, an electroless plating method and a combination thereof, and any of spraying methods and combinations thereof with patterning techniques, if necessary. It will be noted that as the PVD method, mention can be made of (a) various vacuum deposition methods such as an electron beam heating method, a resistance heating method, a flash deposition method and the like, (b) a plasma deposition method, (c) various sputtering methods such as a bipolar sputtering method, a DC sputtering method, a DC magnetron sputtering method, a high frequency sputtering method, a magnetron sputtering method, an ion beam sputtering method, a bias sputtering method and the like, and (d) various ion plating methods such as a DC (direct current) method, an RF method, a multi-cathode method, an activation reaction method, an electric field deposition method, a high frequency ion plating method, a reactive ion plating method and the like.

Materials for the gate insulating layer include not only inorganic insulating materials exemplified as silicon oxide materials, silicon nitrides ($SiN_Y$) and metal oxide high dielectric constant insulating films of, but also organic insulating materials exemplified as polymethyl methacrylate (PMMA), polyvinyl phenol (PVP) and polyvinyl alcohol (PVA), and combinations thereof may also be usable. It will be noted that silicon oxide materials include, for example, silicon oxide ($SiO_x$), BPSG, PSG, BSG, AsSG, PbSG, silicon oxide nitride (SiON), SOG (spin-on-glass), and low dielectric constant $SiO_2$ materials (e.g. polyaryl ethers, cycloperfluorocarbon polymers and benzocyclobutene, cyclic fluorine resins, polytetrafluoroethylene, fluorinated aryl ethers, fluorinated polyimides, amorphous carbon, and organic SOG).

The method of forming the gate insulating layer is any of afore-indicated various PVD methods; various CVD methods; spin coating methods; afore-indicated various printing methods; afore-indicated various coating methods; dipping methods; casting methods; and spraying methods. Alternatively, the gate insulating layer may be formed by oxidizing or nitriding the surface of a gate electrode, or may be obtained by forming an oxide film or nitride film on the surface of the gate electrode. For the oxidation of the surface of a gate electrode, mention is made, for example, of an oxidation method using an $O_2$ plasma or an anodization method although depending on the material for the gate electrode. Still alternatively, for the nitriding of the surface of a gate electrode a nitriding method using an $N_2$ plasma may also be exemplified although depending on the material for the gate electrode. Yet alternatively, a gate insulating layer may be formed on a gate electrode, for example, by self-assembledly covering the gate electrode surface, by a method such as a dipping method, with insulating molecules having a functional group capable of chemically binding to the gate electrode, like a linear hydrocarbon modified with a mercapto group at one terminal thereof relative to an Au electrode.

The portion of the source/drain electrode in contact with an organic semiconductor material layer forming a channel forming region is covered with an electrode covering material and more particularly, at least side faces of the source/drain electrode are covered with an electrode covering material. The source/drain electrode may be covered with an electrode covering material at side faces and a top face thereof. Alternatively, it may be possible that the side faces of the source/drain electrode are covered with an electrode covering material and the top face of the source/drain electrode is covered with an insulating material forming such an insulating film as will be described hereinafter.

The organic semiconductor material for the organic semiconductor material layer serving as a channel forming region is made of organic semiconductor molecules having a conjugated bond and preferably has at opposite terminals of the molecule a thiol group (—SH), an amino group (—$NH_2$), an isocyano group (—NC), a cyano group (—CN), a thioacetoxyl group (—$SCOCH_3$), or a carboxy group (—COOH).

More particularly, the organic semiconductor materials for forming an organic semiconductor material layer used as a channel forming region include pentacene and derivatives thereof (TIPS-pentacene and the like), naphthacene and derivatives thereof (rubrene, hexapropylnaphthacene), P3HT, PQT, F8T2, 4,4'-biphenyldithiol (BPDT) of the structural formula (11), 4,4'-diisocyanobiphenyl of the structural formula (12), 4,4'-diisocyano-p-terphenyl of the structural formula (13), 2,5-bis(5'-thioacetyl-2'-thiophenyl)thiophene of the structural formula (14), 4,4'-diisocyanophenyl of the structural formula (15), benzidine(biphenyl-4,4'-diamine) of the structural formula (16), TCNQ (tetracyanoquinodimethane) of the structural formula (17), biphenyl-4,4'-dicarboxylic acid of the structural formula (18), 1,4-di(4-thiophenylacetylinyl)-2-ethylbenzene of the structural formula (19), and 1,4-di(4-isocyanophenylacetylinyl)-2-ethylbenzene.

Structural formula (11): 4,4'-bipehnyldithiol

[Chemical Formula 10]

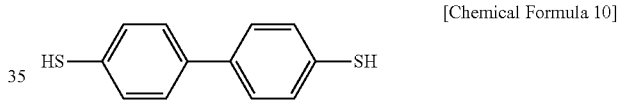

Structural formula (12): 4,4'-diisocyanobiphenyl

[Chemical Formula 11]

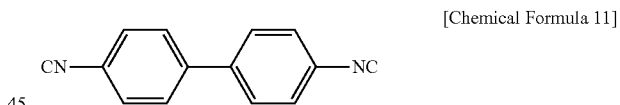

Structural formula (13): 4,4'-diisocyano-p-terphenyl

[Chemical Formula 12]

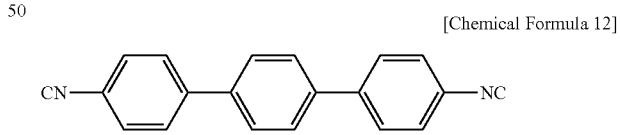

Structural formula (14): 2,5-bis(5'-thioacetyl-2'-thiophenyl)thiophene

[Chemical Formula 13]

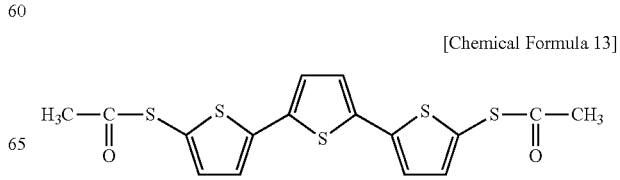

Structural formula (15): 4,4'-diisocyanophenyl

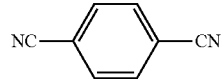

Structural formula (16): benzidine(biphenyl-4,4'-diamine)

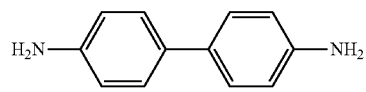

Structural formula (17): TCNQ(tetracyanoquinodimethane)

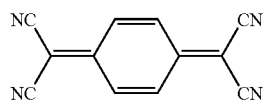

Structural formula (18): biphenyl-4,4'-dicarboxylic acid

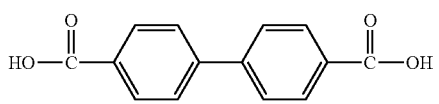

Structural formula (19): 1,4-di(4-thiophenylacetylinyl)-2-ethylbenzene

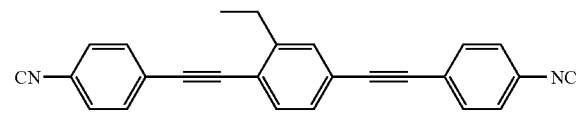

Structural formula (20): 1,4-di(4-isocyanophenylacetylinyl)-2-ethylbenzene

As organic semiconductor molecules, there may be used a dendrimer represented by the structural formula (21).

Structural formula (21): dendrimer

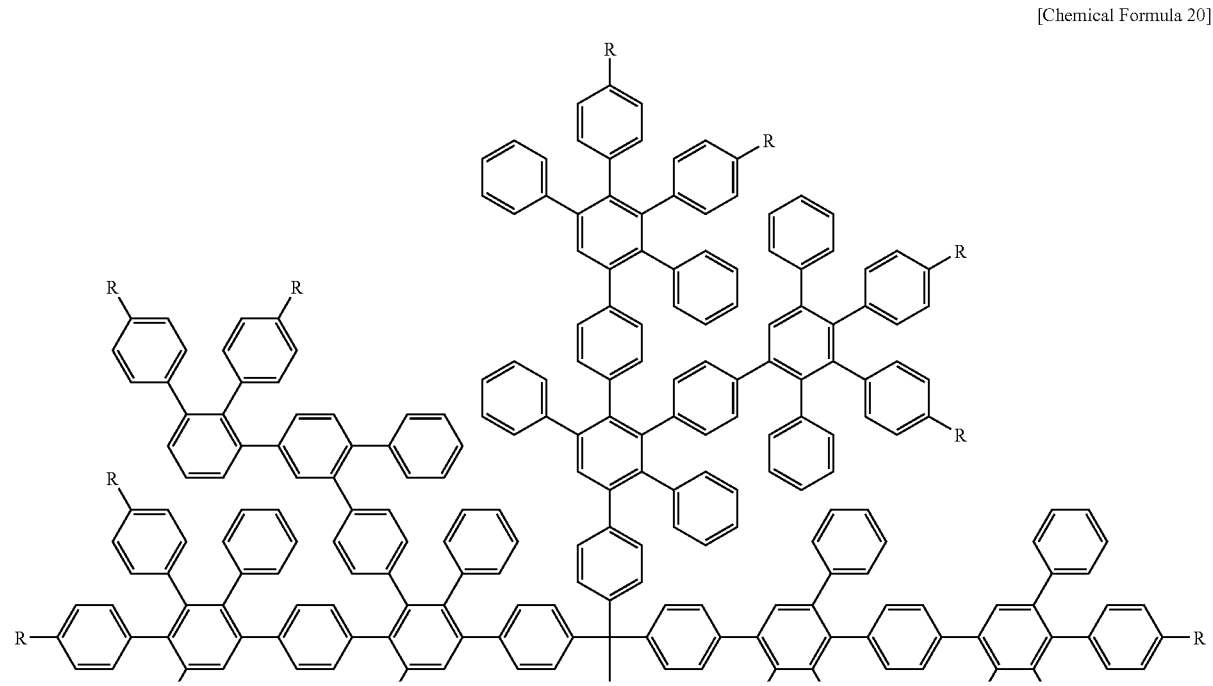

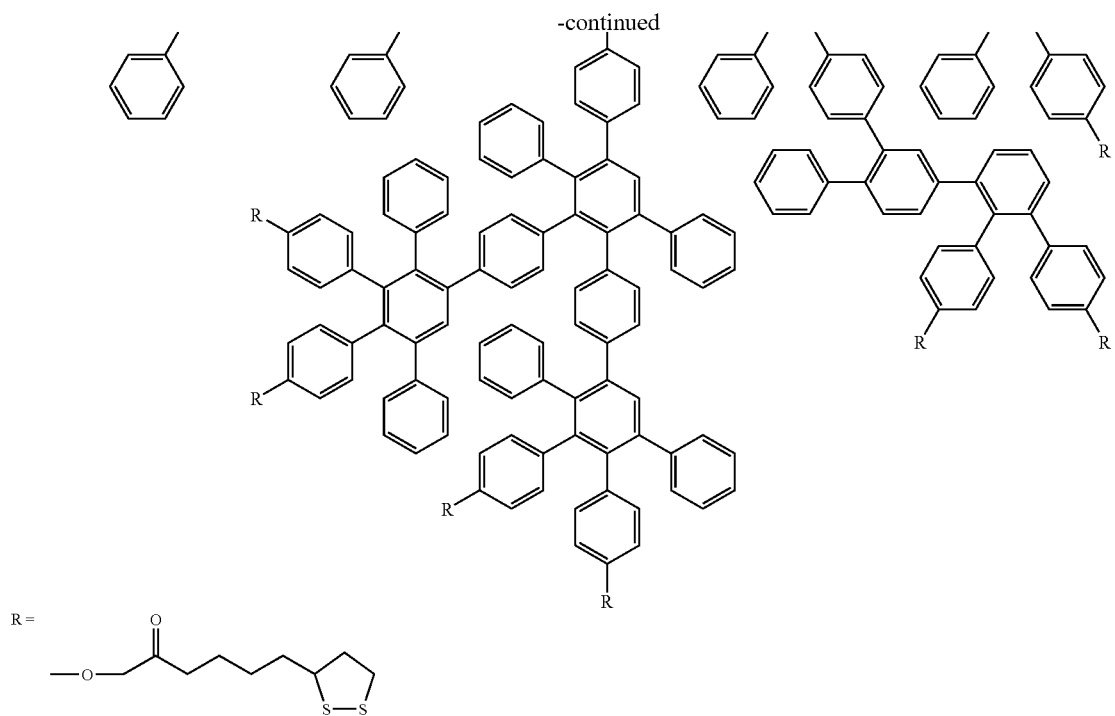

R = 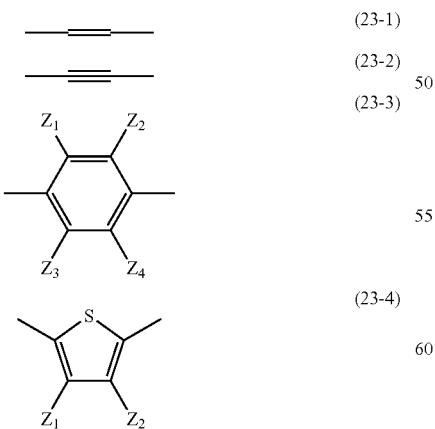

Alternatively, organic molecules represented by the structural formula (22) may also be used as an organic semiconductor material. It will be noted that "X" in the structural formula (22) represents any of the formulas (23-1), (23-2), (23-3) and (23-4), "$Y_1$" and "$Y_2$" in the structural formula (22), respectively, represent any of the formulas (24-1) to (24-9), and "$Z_1$," "$Z_2$," "$Z_3$" and "$Z_4$," respectively, represent any of the formulas (25-1) to (25-11). The value of "n" is 0 or a positive integer. X is one wherein one or more units represented by any of the formulas (23-1), (23-2), (23-3) and (23-4) are repeatedly bound together, including repetitions of different units. Moreover, side chains $Z_1$, $Z_2$, $Z_3$ and $Z_4$ may change into different ones in the course of the repetitions.

[Chemical Formula 21]

$$Y_1-X-Y_2 \quad (22)$$

[Chemical Formula 22]

 (23-1)

—————— (23-2)

(23-3)

(23-4)

[Chemical Formula 23]

—SH (24-1)

—NH$_2$ (24-2)

—COOH (24-3)

—CN (24-4)

—NC (24-5)

—SCOCH$_3$ (24-6)

 (24-7)

—NCS (24-8)

—SCN (24-9)

[Chemical Formula 24]

—H (25-1)

—F (25-2)

—Cl (25-3)

—Br (25-4)

—I (25-5)

—(CH$_2$)$_n$CH$_3$ (25-6)

—O(CH$_2$)$_n$CH$_3$ (25-7)

—(C═O)(CH$_2$)$_n$CH$_3$ (25-8)

—(C═O)O(CH$_2$)$_n$CH$_3$ (25-9)

—NH$_2$ (25-10)

—NO$_2$ (25-11)

It is to be noted that the organic semiconductor material layer can be formed based on a CVD method, a stamping method, a vacuum deposition method, a coating method, a spin coating method, an ink jet method, a dipping method or the like. In this way, a single-layered or multi-layered organic semiconductor material layer can be formed on the basis of a π conjugated complex, a π conjugated complex oligomer or a π conjugated complex polymer. The thickness of the organic semiconductor material layer can be exemplified as ranging from several tens of nm to several μm.

As a specific arrangement and structure of the semiconductor device wherein the semiconductor device is constituted from a bottom gate/bottom contact field effect transistor (FET), this bottom gate/bottom contact field effect transistor includes:

(A) a gate electrode formed on a support;
(B) a gate insulating layer formed on the gate electrode;
(C) source/drain electrodes formed on the gate insulating layer; and
(D) a channel forming region formed between the source/drain electrodes on the gate insulating layer.

Alternatively, where the semiconductor device is constituted from a top gate/bottom contact field effect transistor (FET), this top gate/bottom contact field effect transistor comprises:

(A) source/drain electrodes formed on a support;
(B) a channel forming region formed between the source/drain electrodes on the support;
(C) a gate insulating layer formed on the channel forming region; and
(D) a gate electrode formed on the gate insulating layer.

As a support, mention is made of various types of glass substrates, various types of glass substrates having an insulating film formed on the surface thereof, quartz substrate, quartz substrates having an insulating film formed on the surface thereof, and silicon substrates having an insulating film formed on the surface thereof. Alternatively, mention may also be made, as a support, of organic polymers (in the forms of polymer materials, e.g. flexible plastic films, plastic sheets and plastic substrates made of polymer materials) such as, for example, polymethyl methacrylate (polymethacrylic acid methyl ester, PMMA), polyvinyl alcohol (PVA), polyvinyl phenol (PVP), polyethylene naphthalate (PEN), polysulfone (PSF), polyether sulfone (PES), polyimide, polycarbonate, and polyethylene terephthalate (PET), and also of mica. If a support constituted of such a flexible polymer material as mentioned above is used, it becomes possible to assemble or integrate the resulting semiconductor device, for example, into display devices and electronic devices having a curved shape. Besides, other conductive substrates (metals such as gold, and a substrate made of highly oriented graphite) may also be mentioned as a support. Depending on the arrangement and structure of the semiconductor device, the semiconductor device is disposed on a support member and such a support member may also be constituted of such materials as mentioned above. Here, the insulating film is made, for example, of an insulator such as a silicon-containing material ($SiO_x$, $SiN_y$ or the like), aluminium oxide, metal oxides, a metal salt or the like, or an organic polymer such as polymethyl methacrylate (PMMA), polyvinyl phenol (PVP) or the like. Although the surface of the support should favorably be smooth, no problem is involved if there is such a roughness as not to contribute to the electric conductivity of an organic semiconductor material layer.

Depending on the material for the support, the organic semiconductor material layer may be adversely influenced with respect to the stability thereof. In such a case, it is preferred to form, as an adhesion layer, a silanol derivative on the support surface by a silane coupling method or to form a thin film of a metal salt/metal complex serving as an insulator according to a CVD method or the like.

The channel forming region is formed of an organic semiconductor material layer and, in some case, may contain fine particles of a conductor or semiconductor in the organic semiconductor material layer. In other words, the channel forming region may be constituted of fine particles made of a conductor or semiconductor and organic semiconductor molecules bound with the fine particles. More particularly, it is preferred that the functional group at the terminal end of the organic semiconductor molecule chemically binds to the fine particles. Moreover, it is more preferred that the organic semiconductor molecules and the fine particles are chemically (alternately) bound to each other through the functional groups of the organic semiconductor molecule at opposite ends thereof thereby establishing a network-shaped electrically-conducting path. The three-dimensional network-shaped electrically-conducting path may be formed by a single layer of the bound body of the fine particles and the organic semiconductor molecules or by a laminate structure of the bound body of the fine particles and the organic semiconductor molecules. By the formation of such a network-shaped conducting path, charge movement within the conducting path predominantly occurs in an axial direction of the molecules along the main chain of the organic semiconductor molecules thereby providing a structure wherein no electron movement between the molecules is involved in the conducting path. As a result, there is no limitation on mobility ascribed to by the electron movement between molecules, which causes a low mobility in conventional semiconductor devices using organic semiconductor materials. In contrast, because the mobility in the axial direction of the molecule, e.g. a high mobility based on nonlocalized π electrons, can be utilized to a maximum extent, such a high mobility as would never be experienced can be realized.

The fine particles are made, as a conductor, of a metal such as gold (Au), silver (Ag), platinum (Pt), copper (Cu), aluminium (Al), palladium (Pd), chromium (Cr), nickel (Ni), iron (Fe) or an alloy made of these metals, or are made, as a semiconductor, of cadmium sulfide (CdS), cadmium selenide (CdSe), cadmium telluride (CdTe), gallium arsenide (GaAs), titanium oxide ($TiO_2$) or silicon (Si).

It will be noted that the fine particles of a conductor means those fine particles made of a material whose volume resistivity is on the order of not larger than $10.^{-4}$ Ω·m ($10.^{-2}$ Ω·cm). The fine particles of a semiconductor are ones whose volume resistivity is on the order of from $10.^{-4}$Ω·m ($10.^{-2}$Ω·cm) to $10.^{14}$Ω·m ($10.^{14}$Ω·cm). The average size $R_{AVE}$ of the fine particles ranges $5.0 \times 10^{-10}$ m≤$R_{AVE}$, preferably $5.0 \times 10^{-10}$ m≤$R_{AVE}$≤$1.0 \times 10^{-6}$ m and more preferably $5.0 \times 10^{-10}$ m≤$R_{AVE}$≤$1.0 \times 10^{-8}$ m. The shape of the fine particles may be spherical although not limited thereto. Besides, there may be mentioned, for example, forms of a triangle, a tetrahedron, a cube, a rectangular parallelepiped, a circular cone, a cylindrical column (rod), a triangle pole, fibers, fuzzball-shaped fibers and the like. It will be noted that the average size $R_{AVE}$ of fine particles in forms other than spheres may be provided in such a way that assuming spheres having a volume equal to a measured volume of fine particles other than spherical particles, an average value of diameters of this spheres is taken as an average size $R_{AVE}$ of the fine particles. The average size $R_{AVE}$ of fine particles can be obtained by measuring sizes of fine particles observed, for example, through a transmission electron microscope (TEM).

Where the semiconductor device of the embodiments is applied to and used as a display device or various types of electronic devices, a number of semiconductor devices may be integrated on a support to provide a monolithic integrated circuit, or semiconductor devices may be cut off and individualized for use as discrete parts. Alternatively, a semiconductor device may be sealed with a resin.

It will be noted that in the embodiments, a formula representing an electrode covering material binding to a surface of an electrode made of a metal (i.e. an electrode covering material prior to binding to the surface of the electrode made of a metal) and a formula representing an electrode covering material after bound to the surface of the electrode made of a metal may sometimes differ from each other because of the binding of the electrode covering material to the electrode surface. In such a case, afore-indicated various formulas indicate formulas representing an electrode covering material prior to the binding with the surface of the electrode made of a metal.

In the embodiments, an intermediate compound between inorganic and organic matters, e.g. an organic-inorganic hybrid compound having a rigid $\pi$ conjugated system, is used as an electrode covering material, and the electrode covering material is directly bound to an electrode (or source/drain electrodes), or, for example, an organic semiconductor material for an organic semiconductor material layer and source/drain electrodes are bound through the electrode covering material, so that electron transfer between the organic semiconductor material forming a semiconductor material layer and the source/drain electrodes becomes easy. Eventually, there can be achieved, for example, a high mobility and a low contact resistance in the semiconductor device.

In the complex-forming reaction between a metal ion and an organic ligand, when both are appropriately combined, a metal-ligand bond can be formed at high probability. Especially, when an organic ligand having two or more functional groups capable of coordinate bonding with a metal ion and a metal ion are reacted with each other, sequential reactions proceed, so that a high-molecular-weight complex wherein metal ions are set in line on the main chain can be formed.

It will be noted that where organic molecules are provided as an electron transfer medium, it is well known that an efficiency of electron transfer is such that alkane molecules ($\sigma$ bond)<alkene/alkyne molecule ($\pi$ bond). Moreover, when adding a group of alkene/alkyne compounds having organometal ion species (d-$\pi$ bond) thereto, a bond<$\pi$ bond<<d-$\pi$ bond is established and thus, the group of molecules bound with the d-$\pi$ bond is most suitable from the standpoint of the ease in the electron transfer.

Additional features and advantages are described herein, and will be apparent from, the following Detailed Description and the figures.

BRIEF DESCRIPTION OF THE FIGURES (A) and (B) of FIG. 1 are, respectively, a schematic, partially sectional view, of a semiconductor device of Example 1 and (C) of FIG. 1 is a conceptual view of a channel forming region and its neighborhood of the semiconductor device of Example 1.

FIG. 2 is a schematic, partially sectional view, of a semiconductor device of Example 2.

(A) and (B) of FIG. 3 are, respectively, conceptual views of a channel region and its neighborhood of semiconductor devices of Example 3 and Example 4.

DETAILED DESCRIPTION

Example 1

Figure 1:
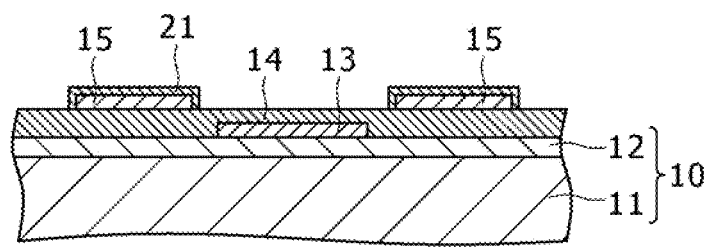
Figure 1:
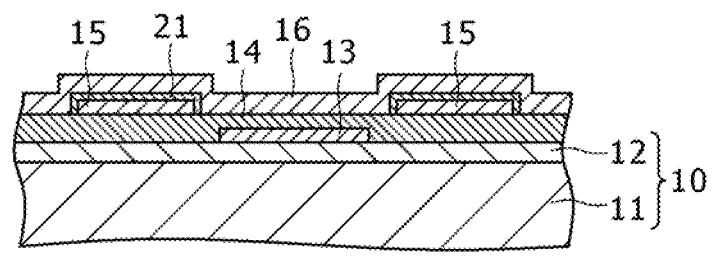
Figure 1:
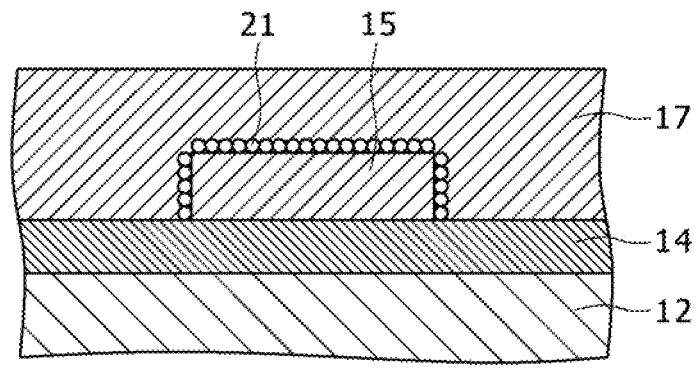

Example 1 relates to an electrode covering material according to a first embodiment, an electrode structure according to a first embodiment and a semiconductor device according to a first embodiment. The semiconductor device of Example 1, or semiconductor devices of Example 2 to Example 4 appearing hereinafter comprises a field effect transistor including a gate electrode 13, a gate insulating layer 14, a channel forming region 16 constituted of an organic semiconductor material layer 17, and source/drain electrodes 15 made of a metal. And the source/drain electrodes 15 at portions thereof in contact with the organic semiconductor material layer 17 forming the channel forming region 16 are covered with electrode covering materials 21, 121, 221. The electrode structures of Example 1 or Example 2 to Example 4 appearing hereinafter comprise an electrode 15, and electrode covering materials 21, 121, 221 covering the surface of the electrode 15 therewith.

The semiconductor device of Example 1 more particularly comprises a bottom gate/bottom contact field effect transistor (FET) and still more particularly, of a thin film transistor (TFT). This bottom gate/bottom contact TFT includes, as shown in (B) of FIG. 1 which is a schematic, partially sectional view, with (A) a gate electrode 13 formed on a support 10,
(B) a gate insulating layer 14 formed on the gate electrode 13,
(C) source/drain electrodes 15 formed on the gate insulating layer 14, and
(D) a channel forming region 16 provided between the source/drain electrodes 15 and on the gate insulating layer 14.

And the electrode covering material 21 is made of organic molecules represented by the formula (1) wherein the functional group Y binds to the surface of the electrode 15 (or the source/drain electrodes 15) made of a metal.

Here, in Example 1, X in the formula (1) is nil, Y in the formula (1) is the formula (3-1), i.e. "—SH," $R_1$ and $R_2$ in the formula (1) are, respectively, the formula (4-1), and $Z_1$, $Z_2$, $Z_3$, $Z_4$, $Z_5$ and $Z_6$ are, respectively, the formula (5-1), i.e. "-II." More particularly, the electrode covering material 21 is made of organic molecules (terpyridinethiol) represented by the formula (31). It will be noted that with the electrode covering material 21 after binding to the surface of the electrode made of a metal, "H" is eliminated from "—SH" of the formula (31), resulting in "—S—."

[Chemical Formula 25]

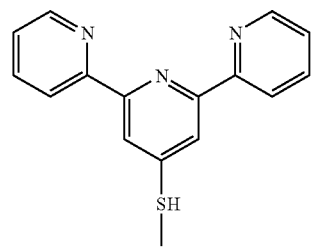

(31)

Also, the gate electrode 13 is made of an aluminium (Al) layer, the gate insulating layer 14 is formed of $SiO_2$, the source/drain electrodes 15 are made of a gold (Au) layer, and the channel forming region 16 is made of pentacene. The conceptual view of the channel forming region 16 and its neighborhood is shown in (C) of FIG. 1 wherein the surfaces of the source/drain electrodes 15 are covered with the electrode covering material 21. It is to be noted that in (C) of FIG. 1, the organic molecules represented by the formula (31) are schematically indicated as a circle.

The outline of a method of fabricating the semiconductor device of Example 1 is now illustrated below.

[Step-100]

Initially, a gate electrode 13 is formed on a support 10. More particularly, a resist layer (not shown), in which a portion at which the gate electrode 13 is to be formed is removed, is formed on an insulating film 12, which has been formed on a surface of a glass substrate 11 and made of $SiO_2$, on the basis of a lithographic technique. Thereafter, a 0.5 nm thick chromium (Cr) layer (not shown) serving as an adhesion layer and a 25 nm thick aluminium (Al) layer serving as the gate electrode 13 are successively formed entirely on the surface according to a vacuum deposition method, followed by removal of the resist layer. In this way, the gate electrode 13 can be obtained based on a so-called lift-off method.

[Step-110]

Next, a gate insulating film 14 is formed on the support 10 including the gate electrode 13 (more particularly, on the insulating film 12 formed on the surface of the glass substrate 11). More particularly, a 150 nm thick gate insulating film 14 made of $SiO_2$ is formed on the gate electrode 13 and the insulating film 12 based on a sputtering method. In the course of the formation of the gate insulating layer 14, if part of the gate electrode 13 is covered with a hard mask, a lead portion (not shown) of the gate electrode 13 can be formed without resorting to a lithographic process.

[Step-120]

Thereafter, source-drain electrodes 15 made of a gold (Au) layer are formed on the gate insulating layer 14. More particularly, an about 0.5 nm thick titanium (Ti) layer (not shown) serving as an adhesion layer and an about 25 nm thick gold (Au) layer serving as source/drain electrodes 15 are successively formed according to a vacuum deposition method. In the course of the formation of these layers, if part of the gate insulating layer 14 is covered with a hard mask, the source/drain electrodes 15 can be formed without resorting to a lithographic process.

[Step-130]

Next, an OH group is formed on the surface of the gate insulating layer 14 made of $SiO_2$ by use of a UV ozone generator, followed by immersion of the entire body in a toluene solution of 10% hexamethyldisilazane (HMDS) to form a single-layer film of HMDS, which serves as an underlying layer of an organic semiconductor material layer 17 to be formed in a subsequent step, on the surface of the gate insulating layer 14. It will be noted that in the drawings, an illustration of the single-layer film of HMDS is omitted.

[Step-140]

Thereafter, the surfaces of the electrodes (source/drain electrodes 15) were covered with an electrode covering material 21 (see (A) of FIG. 1). More particularly, the electrodes (source/drain electrodes 15) were covered on the surface thereof with an electrode covering material 21 as a terpyridine thiol self-assembled monomolecular film by immersing the entire body in a chloroform solution of 0.1 mmol/liter of terpyridine disulfide represented by the formula (31) for 18 hours.

[Step-150]

Next, pentacene was deposited over the entire surface by use of a vacuum deposition apparatus to form a channel forming region 16 (see (B) of FIG. 1). The channel forming region 16 positioned between the source/drain electrodes 15 above the gate insulating layer 14 was set at 50 nm thick.

[Step-160]

Finally, a passivation film (not shown) is formed over the entire surface to obtain bottom gate/bottom contact FET (more particularly, TFT).

Example 2

Example 2 is a variation of Example 1. In Example 2, the semiconductor device was provided as top gate/bottom contact FET (more particularly, TFT). That is, the top gate/bottom contact TFT provided as a semiconductor device of Example 2 includes, as shown in (B) of FIG. 2 that is a schematic, partially sectional view, (A) source/drain electrodes 15 formed on a support 10, (B) a channel forming region 16 formed between the source/drain electrodes 15 on the support 10, (C) a gate insulating layer 14 formed on the channel forming region 16, and (D) a gate electrode 13 formed on the gate insulating layer 14.

And the surfaces of the source/drain electrodes 15 are covered with an electrode covering material 21.

The outline of a method of fabricating the semiconductor device of Example 2 is illustrated below.

[Step-200]

First, source-drain electrodes 15 are formed on an insulating film 12 in a manner similar to [Step-120] of Example 1.

[Step-210]

Next, in the same manner as in [Step-130] of Example 1, a single-layer film of HMDS is formed on the surface of the support (more particularly, the insulating film 12).

[Step-220]

Figure 2:
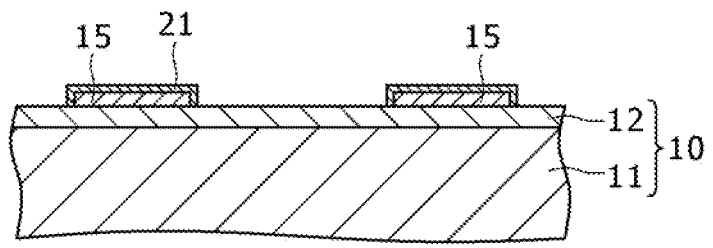
Figure 2:
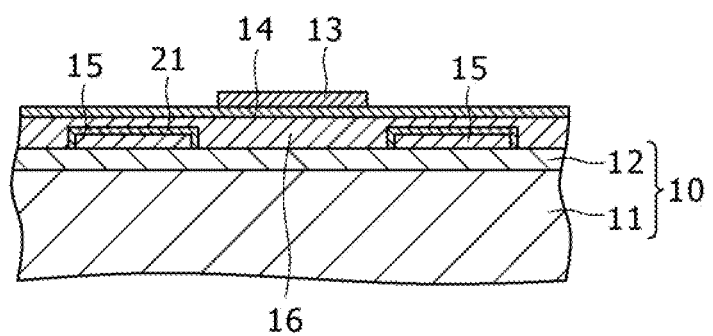

Thereafter, in the same manner as in [Step-140] of Example 1, the surfaces of the electrodes (source/drain electrodes 15) are covered with an electrode covering material 21 (see (A) of FIG. 2).

[Step-230]

Next, in the same manner as in [Step-150] of Example 1, 50 nm thick pentacene is deposited over the whole surface to form a channel forming region 16.

[Step-240]

Subsequently, a gate insulating layer 14 is formed over the entire surface in the same manner as in [Step-110] of Example 1, followed by forming a gate electrode 13 on the gate insulating layer 14 in the same manner as in [Step-100] of Example 1 (see (B) of FIG. 2).

[Step-250]

Finally, a passivation film (not shown) is formed over the entire surface to obtain top gate/bottom contact FET (particularly, TFT).

Example 3

Example 3 relates to an electrode-covering material according to a second embodiment, an electrode structure according to a second embodiment, and a semiconductor device according to a second embodiment o and also to an electrode covering material according to a fourth embodiment, an electrode structure according to a fourth embodiment, and a semiconductor device according to a fourth embodiment. More particularly, the semiconductor device of Example 3 is made up of bottom gate/bottom contact FET and this bottom gate/bottom contact FET (more particularly, TFT) has such an arrangement and structure as shown in a schematic, partially sectional view of (B) of FIG. 1. Alternatively, the semiconductor device of Example 3 may be more particularly be made up of top gate/bottom contact FET and this top gate/bottom contact FET (more particularly, TFT) has such an arrangement and structure as shown in a schematic, partially sectional view of (B) of FIG. 2. Accordingly, an illustration of a specific arrangement and structure of the semiconductor device of Example 3 is omitted herein.

An electrode covering material 121 is made of organic molecules represented by the formula (1) wherein a functional group Y binds to the surface of the electrodes 15 (or source/drain electrodes 15) made of a metal, and at least one member selected from the group consisting of a nitrogen atom, a functional group $R_1$ and a functional group $R_2$ in the formula (1) binds to a metal ion to form a chelate.

In Example 3, X in the formula (1) is nil, Y in the formula (1) represents the formula (3-1), i.e. "—SH," $R_1$ and $R_2$ in the formula (1), respectively, represent the formula (4-1), $Z_1$, $Z_2$, $Z_3$, $Z_4$, $Z_5$ and $Z_6$, respectively, represent the formula (5-1), i.e. "—H," and the metal ion is an iron (Fe) ion. More particularly, the electrode covering material 121 consists of organic molecules represented by the formula (32). The nitrogen atom, functional group $R_1$ and functional group $R_2$ in the formula (1) bind to the metal ion to form a chelate. It will be noted that in the electrode covering material 121 after binding to the surface of the electrode made of a metal, "H" is taken out from "—SH-" in the formula (32) to provide "—S—."

[Chemical Formula 26]

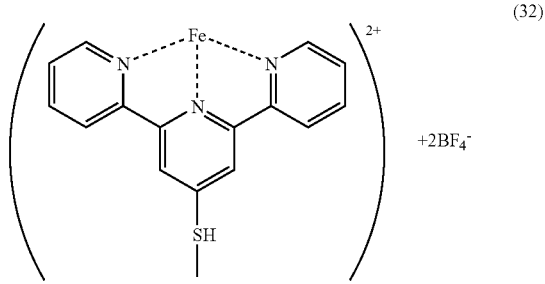

(32)

Still alternatively, the electrode covering material 121 is made of organic molecules that have a functional group capable of binding with a metal ion and a functional group binding to an electrode (or source/drain electrodes 15) made of a metal. And the binding between the functional group capable of binding to the metal ion and the metal ion results in the formation of a chelate. The functional group capable of binding with a metal ion is terpyridine herein and the functional group binding to the electrode (or source/drain electrodes 15) made of a metal is a thiol group.

Figure 3:
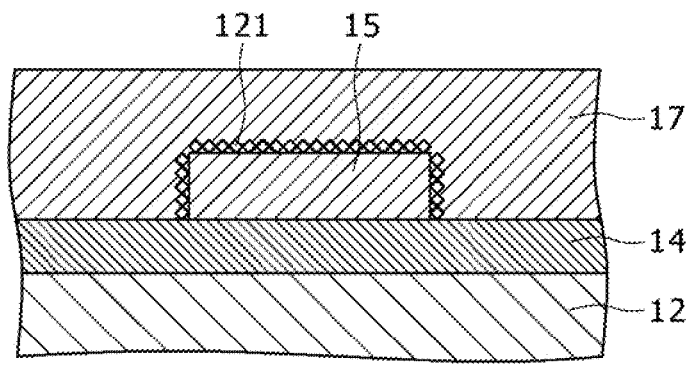
Figure 3:
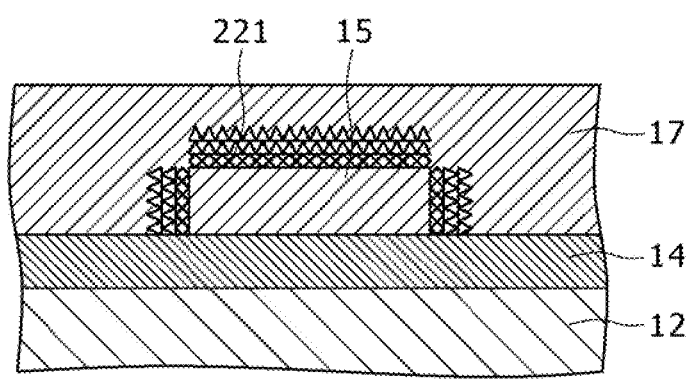

Also, the gate electrode 13 is made of an aluminium (Al) layer, the gate insulating layer 14 is made of $SiO_2$, the source/drain electrodes 15 are made of a gold (Au) layer, and the channel forming region 16 consists of pentacene. The channel forming region 16 and its neighborhood are conceptually shown in (A) of FIG. 3 wherein the surfaces of the source/drain electrodes 15 are covered with the electrode covering material 121. It will be noted that in (A) of FIG. 3, the organic molecules represented by the formula (32) are schematically indicated in the form of rhombi.

The semiconductor device of Example 3 can be obtained by the following treatment subsequent to the [Step-140] of Example 1 or [Step-220] of Example 2.

That is, the entire body is cleaned with chloroform, followed by immersion of the entire body in an ethanol solution of 0.1 mol/liter of iron (II) tetrafluoroborate ($Fe^{2+}(BF_4)_2^-$) for one day to allow the $Fe^{2+}$ ion to bind to the terpyridine moiety of the terpyridine thiol.

Except for this treatment, the semiconductor device of Example 3 can be fabricated based on the fabrication method of a semiconductor device illustrated in Example 1 or Example 2, for which detailed illustration is omitted herein.

Example 4

Example 4 relates to an electrode covering material according to a third embodiment, an electrode structure according to a third embodiment, and a semiconductor device according to a third embodiment, and also to electrode covering material according to a fourth embodiment o, an electrode structure according to a fourth embodiment, and a semiconductor device according to a fourth embodiment. In particular, the semiconductor device of Example 4 includes bottom gate/bottom contact FET. This bottom gate/bottom contact FET (more particularly, TFT) has such an arrangement and structure as shown in a schematic, partially sectional view in (B) of FIG. 1. Alternatively, the semiconductor device of Example 4 includes top gate/bottom contact FET, and this top gate/bottom contact FET (more particularly, TFT) has such an arrangement and structure as shown in a schematic, partially sectional view in (B) of FIG. 2. Accordingly, an illustration of a specific arrangement and structure of the semiconductor device of Example 4 is omitted.

And an electrode covering material 221 includes first organic molecules and second organic molecules. The first organic molecules are organic molecules represented by the formula (1) and the second organic molecules are organic molecules represented by the formula (6). The functional group Y in the formula (1) binds to the surface of an electrode (or source/drain electrodes) made of a metal, at least one member selected from the group consisting of a nitrogen atom, a functional group $R_1$ and a functional group $R_2$ in the formula (1) binds to a metal ion to form a chelate, at least one member selected from the group consisting of a functional group $R'_1$, a functional group $R'_2$ and a nitrogen atom (adjacent nitrogen atom A) adjacent to the functional group $R'_1$ in the formula (6) binds to a metal ion to form a chelate, and/or (more particularly, "and" in Example 4) at least one member selected from the group consisting of a functional group $R'_3$, a functional group $R'_4$ and a nitrogen atom (adjacent nitrogen atom B) adjacent to the functional group $R'_3$ in the formula (6) binds to a metal ion to form a chelate.

Here, X in the formula (1) is nil, Y in the formula (1) represents the formula (3-1), i.e. "—SH," $R_1$ and $R_2$ in the formula (1), respectively, the formula (4-1), $Z_1$, $Z_2$, $Z_3$, $Z_4$, $Z_5$ and $Z_6$, respectively, represent the formula (5-1), i.e. "—H," and the metal ion is an iron (Fe) ion. The nitrogen atom, the functional group $R_1$ and the functional group $R_2$ in the formula (1) bind to the metal ion to form a chelate. That is, the first organic molecules more particularly consist of organic molecules represented by the formula (32) as illustrated in Example 3.

Figure 4:
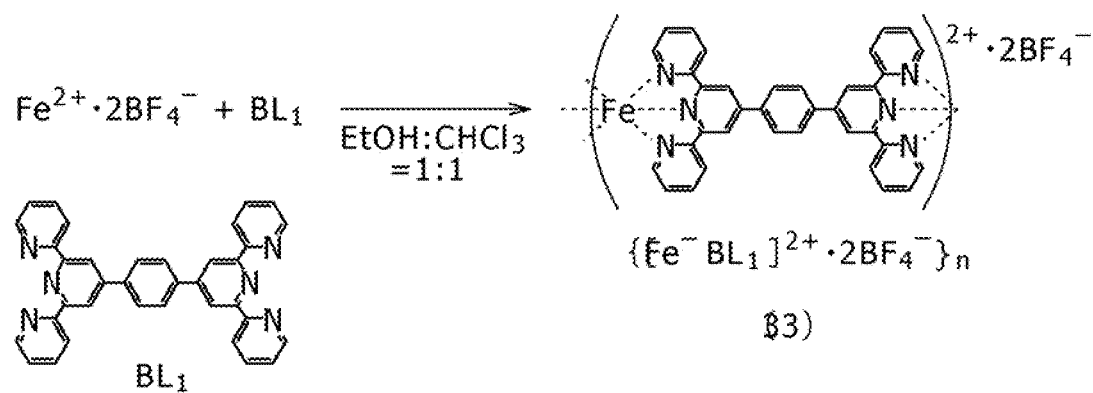
FIG. 4 is a view showing a synthetic scheme of a $\pi$ conjugated iron polymer in Example 4.

On the other hand, X' in the formula (6) represents the formula (7-5) (provided that n=1), $R'_1$, $R'_2$, $R'_3$ and $R'_4$ in the formula (6), respectively, represent the formula (8-1), $Z'_1$, $Z'_2$, $Z'_3$, $Z'_4$, $Z'_5$ and $Z'_6$, respectively, represent the formula (9-1), i.e. "—H," and the metal ion is an iron (Fe) ion. The functional group $R'_1$, the functional group $R'_2$ and the adjacent nitrogen atom A in the formula (6) bind to the metal ion to form a chelate, and the functional group $R'_3$, the functional group $R'_4$ and the adjacent nitrogen atom B in the formula (6) bind to the metal ion to form a chelate. That is, the second organic molecules particularly consist of organic molecules represented by the formula (33) indicated at the right side of FIG. 4.

In Example 4, the electrode covering material 221 includes organic molecules having a functional group capable of binding to a metal ion and a functional group binding to an electrode (or source/drain electrodes 15) made of a metal. And binding between the functional group capable of binding to a metal ion and the metal ion results in formation of a chelate. The functional group capable of binding to a metal ion is terpyridine, and a functional group binding to an electrode (or source/drain electrodes 15) made of a metal is a thiol group.

Also, the gate electrode 13 is made of an aluminium (Al) layer, the gate insulating layer 14 is made of $SiO_2$, the source/drain electrodes 15 are each made of a gold (Au) layer, and the channel forming region 16 is made of pentacene. The conceptual view of the channel forming region 16 and its neighborhood is shown in (B) of FIG. 3 wherein the surfaces of the source/drain electrodes 15 are covered with the electrode covering material 221.

A π conjugated iron polymer $\{[Fe-BL_1]^{2+} \cdot 2BF_4\}$ is preliminarily prepared. More particularly, when iron (II) tetrafluoroborate and organic molecules $BL_1$ (see the scheme of FIG. 4) are mixed at a ratio of 1:1 in a 1:1 mixed solution of ethanol and chloroform, the π conjugated iron polymer can be obtained (see the formula (33) in the scheme in FIG. 4).

The semiconductor device of Example 4 can be obtained by subjecting to the following treatment subsequent to [Step-140] of Example 1 or subsequent to [Step-220] of Example 2.

That is, like Example 3, the entire body is initially cleaned with chloroform, after which the body is immersed in an ethanol solution of 0.1 mol/liter of iron(II) tetrafluoroborate $(Fe^{2+}(BF_4)_2^-)$ for 1 day to permit $Fe^{2+}$ ion to bind to the terpyridine moiety of terpyridinethiol.

Next, after cleaning with ethanol, the operation of immersing the entire body in a 1:1 mixed solution of ethanol and chloroform containing the π conjugated iron polymer for 15 minutes is repeated twice. In this way, as shown in (B) of FIG. 3, the source/drain electrodes 15 are covered on the surface thereof with the electrode covering material 221. It will be noted that in (B) of FIG. 3, the first organic molecules represented by the formula (32) are schematically shown in the form of rhombi and the second organic molecules represented by the formula (33) are schematically shown in the form of triangles.

Except for the above treatment, the semiconductor device of Example 4 can be fabricated based on the fabrication method of a semiconductor device illustrate in Example 1 or Example 2, and detailed description is omitted herein.

In Example 1, Example 3 and Example 4, the bottom gate/bottom contact TFTs were experimentally made. It will be noted that in the respective examples, five types of TFTs having channel lengths of 10 μm, 20 μm, 50 μm, 70 μm and 100 μm were made. The channel width was set at 5.6 mm in all trial products.

Figure 5:
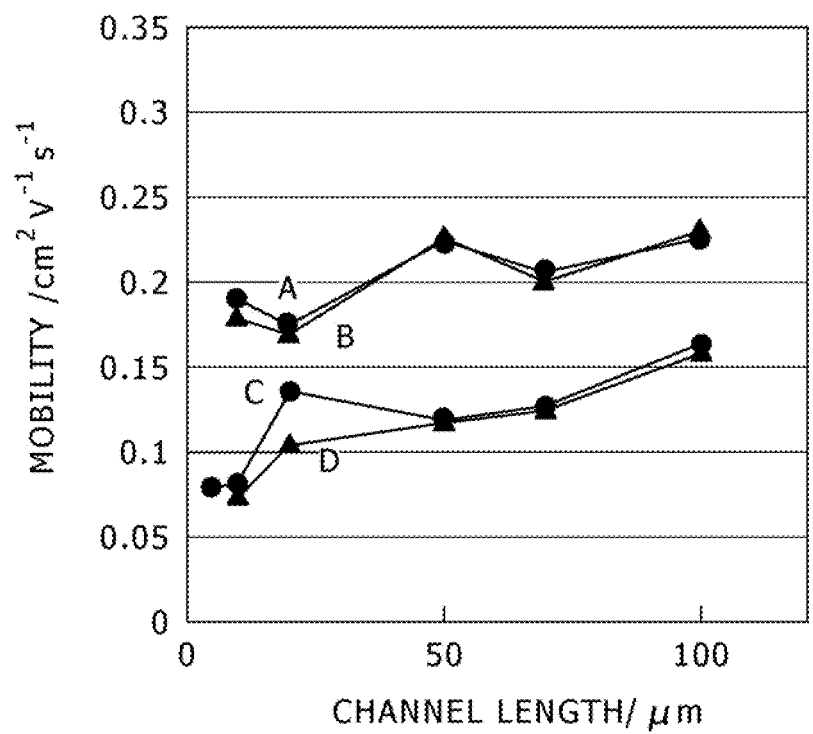
FIG. 5 is a graph showing the relation between the mobility and the channel length of bottom gate/bottom contact TFT prototypes of Example 1 and Example 3.

The results of measurements of the thus obtained trial products are shown in Table 1 below with respect to an average value of contact resistance R (unit: KΩ), an average value of mobility $\mu_1$ (unit: $cm^2 \cdot V^{-1} \cdot second^{-1}$) and an average value of mobility $\mu_2$ (unit: $cm^2 \cdot V^{-1} \cdot second^{-1}$). The relationship between the mobility and the channel length of the bottom gate/bottom contact TFT trial products of Example 1 and Example 3 (provided that $V_d = -5$ volts) is shown in FIG. 5. It will be noted that in FIG. 5, the black circles indicated by "A" show the results of measurement of mobility $\mu_1$ in the saturation region of Example 3, the black triangles indicated by "B" show the results of measurement of mobility $\mu_2$ in the linear region of Example 3, the black circles indicated by "C" show the results of measurement of mobility $\mu_1$ in the saturation region of Example 1, and the black triangles indicated by "D" show the results of measurement of mobility $\mu_2$ in the linear region of Example 1.

TABLE 1

|  | R | $\mu_1$ | $\mu_2$ |
| --- | --- | --- | --- |
| Example 1 | 5.7 | 0.16 | 0.16 |
| Example 3 | 2.4 | 0.22 | 0.23 |
| Example 4 | 17 | 0.09 | 0.08 |

For comparison, a bottom gate/bottom contact TFT was experimentally made by a procedure wherein [Step-140] was omitted in Example 1 and subjected to measurement of a contact resistance, revealing always a very high value of 30 kΩ to 40 kΩ. Moreover, the values of $\mu_1$ and $\mu_2$ were, respectively, such that $\mu_1 = 0.05$, and $\mu_2 = 0.03$.

In this manner, when the electrode and the electrode covering material composed of an organic-inorganic hybrid compound (a π conjugated complex, a π conjugated complex oligomer or a π conjugated complex polymer) are directly chemically bound together, the electron transfer between the source/drain electrodes made of a metal and the channel forming region made up of an organic semiconductor material layer is supplemented with the electrode covering material, so that the contact resistance can be significantly reduced and high mobility can be realized. It has been shown that with conjugated complex polymers, the transfer speed of charges passing through the main chain is higher than that of ordinary organic conductive polymers, thus a satisfactory improvement in conductivity being theoretically supported. From FIG. 5, it will be seen that where the channel length is at 10 μm, the lowering of mobility is not appreciable.

The structure and arrangement, forming conditions and fabrication conditions of the semiconductor devices are described by way of example and may be appropriately varied. Where the field effect transistors (FET) obtained according to the present invention are applied to and used in display devices and various types of electronic devices, a number of FETs may be integrated on a support or support member to provide a monolithic integrated circuit, or individual FETs may be cut off for use as discrete parts. In the examples, the electrodes are provided solely as the source/drain electrodes and are not limited to the source/drain electrodes. The electrode covering material may be widely applicable to electrodes in fields requiring the passage of a current to a layer made of an organic conductive polymer (conductive material) or an organic semiconductive material or the application of a voltage.

In some cases, the electrode covering material may be made up of first organic molecules and third organic molecules. The first organic molecules consist of organic molecules represented by the formula (1) as stated hereinbefore. On the other hand, the third organic molecules consist of organic molecules represented by the formula (100-1), the formula (100-2) or the formula (100-3). The functional group Y in the formula (1) binds to the surface of an electrode made of a metal and at least one member selected from the group consisting of the nitrogen atom, functional group $R_1$ and functional group $R_2$ in the formula (1) binds to a metal to form a chelate, and at least one member selected from the group consisting of the functional group $Y'_1$, functional group $Y'_2$, functional group $Y'_3$ and functional group $Y'_4$ of the formula (100-1), the formula (100-2) or the formula (100-3) binds to a metal ion.

In this regard, however, X in the formula (1) is, as stated hereinbefore, any of the formulas (2-1) to (2-10) or nil, Y in the formula (1) is any of the formulas (3-1) to (3-12), $R_1$ and $R_2$ in the formula (1), respectively, represent any of the formulas (4-1) to (4-19), and $Z_1$, $Z_2$, $Z_3$, $Z_4$, $Z_5$ and $Z_6$, respectively, represent any of the formulas (5-1) to (5-18). On the other hand, X" in the formula (100-1), the formula (100-2) or the formula (100-3) is, as stated before, any of the formulas (2-1) to (2-10), $Y''_1$, $Y''_2$, $Y''_3$ and $Y''_4$ in the formula (100-1), the formula (100-2) or the formula (100-3), respectively, represent any of the following formulas (101-1) to (101-15), $W''_1$ and $W''_2$, respectively, represent any of the following formulas (102-1) to (102-18), and n and m are integers of 1 or over.

[Chemical Formula 27]

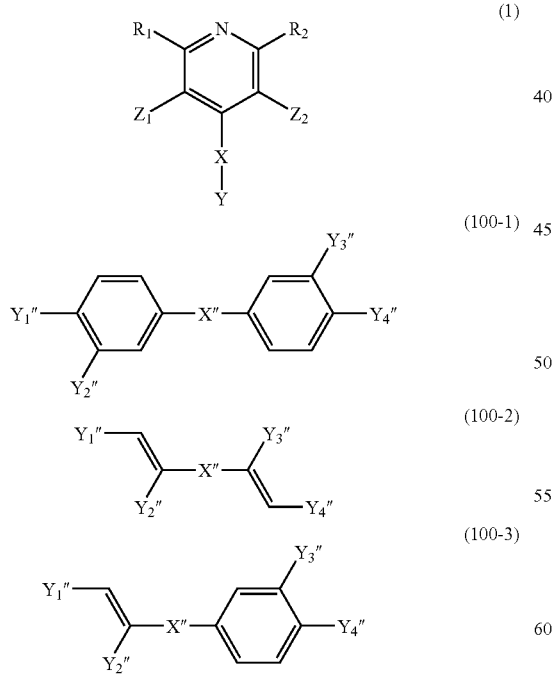

[Chemical Formula 28]

| | |
|---|---|
| —SH | (101-1) |
| —OH | (101-2) |
| —NH$_2$ | (101-3) |
| —COOH | (101-4) |
| —(C=O)H | (101-5) |
| —(C=O)CH$_3$ | (101-6) |
| —(C=O)(CH$_2$)$_m$CH$_3$ | (101-7) |
| —(C=O)OCH$_3$ | (101-8) |
| —(C=O)O(CH$_2$)$_m$CH$_3$ | (101-9) |
| —C$_6$H$_5$ | (101-10) |
| —(C=O)C$_6$H$_5$ | (101-11) |
| —(C=O)OC$_6$H$_5$ | (101-12) |

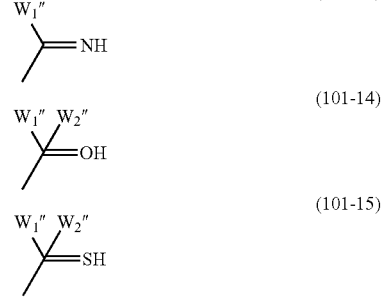

[Chemical Formula 29]

| | |
|---|---|
| —H | (102-1) |
| —F | (102-2) |
| —Cl | (102-3) |
| —Br | (102-4) |
| —I | (102-5) |
| —CH$_3$ | (102-6) |
| —(CH$_2$)$_m$CH$_3$ | (102-7) |
| —OCH$_3$ | (102-8) |
| —O(CH$_2$)$_m$CH$_3$ | (102-9) |
| —COOH | (102-10) |
| —(C=O)H | (102-11) |
| —(C=O)CH$_3$ | (102-12) |
| —(C=O)(CH$_2$)$_m$CH$_3$ | (102-13) |
| —(C=O)OCH$_3$ | (102-14) |
| —(C=O)O(CH$_2$)$_m$CH$_3$ | (102-15) |
| —C$_6$H$_5$ | (102-16) |
| —(C=O)C$_6$H$_5$ | (102-17) |
| —(C=O)OC$_6$H$_5$ | (102-18) |

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:
1. An electrode covering material comprising:
organic molecules represented by Chemical Formula (1) wherein a functional group Y binds to a surface of an electrode made of a metal

[Chemical Formula (1)]

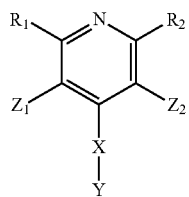

(1)

wherein in the Chemical Formula (1) X is any of Chemical Formulas (2-1) to (2-10), Y in the Chemical Formula (1) is any of the following Chemical Formulas (3-1) to (3-12), $R_1$ and $R_2$ in the Chemical Formula (1) are, respectively, any of the following Chemical Formulas (4-1) to (4-19), $Z_1, Z_2, Z_3, Z_4, Z_5$ and $Z_6$ are, respectively, any of the following Chemical Formulas (5-1) to (5-18), and n and m are, respectively an integer of 1 or over

[Chemical Formulas (2-1) to (2-10)]

—(≡)$_n$— (2-1)

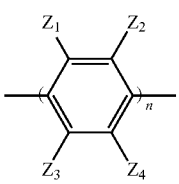 (2-2)

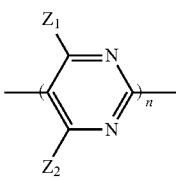 (2-3)

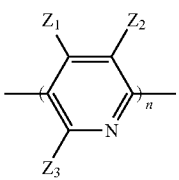 (2-4)

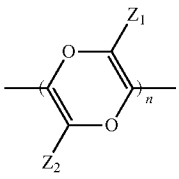 (2-5)

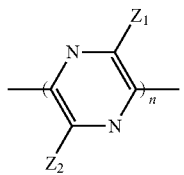 (2-6)

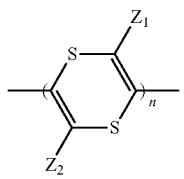 (2-7)

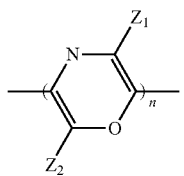 (2-8)

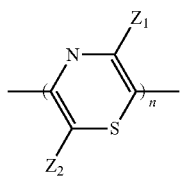 (2-9)

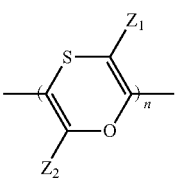 (2-10)

[Chemical Formulas (3-1) to (3-12)]

HS— (3-1)

HOOC— (3-2)

$H_2N$— (3-3)

HOSi— (3-4)

—S— (3-5)

NC— (3-6)

OCN— (3-7)

NCS— (3-8)

HO— (3-9)

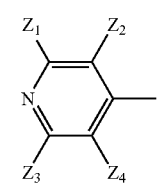 (3-10)

(3-11)
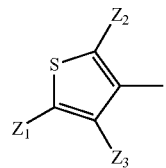
(3-12)
[Chemical Formulas (4-1) to (4-19)]
(4-1)
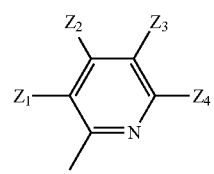
(4-2)
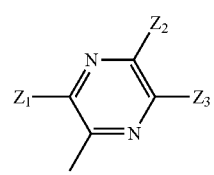
(4-3)
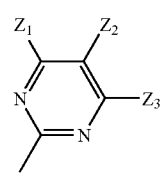
(4-4)
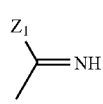
(4-5)
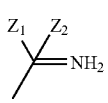
(4-6)
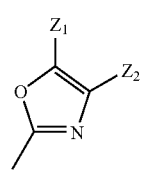
(4-7)
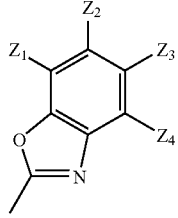
(4-8)
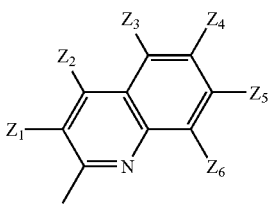
(4-9)
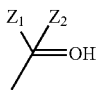
(4-10)
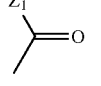
(4-11)
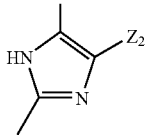
(4-12)
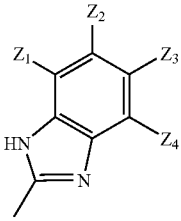
(4-13)
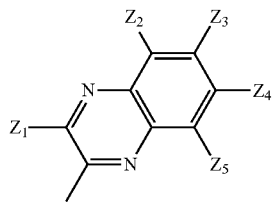
(4-14)
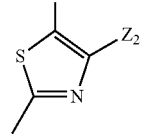
(4-15)
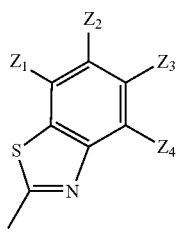
(4-16)
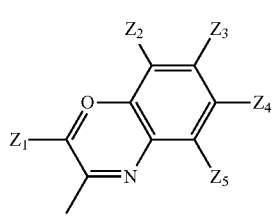

[Chemical Formula (1)]

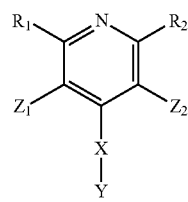

wherein X in the formula (1) is any of Chemical Formulas (2-1) to (2-10), Y in the Chemical Formula (1) is any of Chemical Formulas (3-1) to (3-12), $R_1$ and $R_2$ in the formula (1) are, respectively, any of Chemical Formulas (4-1) to (4-19), $Z_1$, $Z_2$, $Z_3$, $Z_4$, $Z_5$ and $Z_6$, respectively, are any of Chemical Formulas (5-1) to (5-18), and n and m are integers of 1 or over

[Chemical Formulas (4-17) to (4-19)]

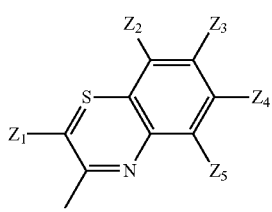  (4-17)

  (4-18)

  (4-19)

[Chemical Formulas (5-1) to (5-18)]

—H  (5-1)
—F  (5-2)
—Cl  (5-3)
—Br  (5-4)
—I  (5-5)
—CH₃  (5-6)
—(CH₂)ₘCH₃  (5-7)
—OCH₃  (5-8)
—O(CH₂)ₘCH₃  (5-9)
—COOH  (5-10)
—(C=O)H  (5-11)
—(C=O)CH₃  (5-12)
—(C=O)(CH₂)ₘCH₃  (5-13)
—(C=O)OCH₃  (5-14)
—(C=O)O(CH₂)ₘCH₃  (5-15)
—C₆H₅  (5-16)
—(C=O)C₆H₅  (5-17)
—(C=O)OC₆H₅  (5-18)

[Chemical Formulas (2-1) to (2-10)]

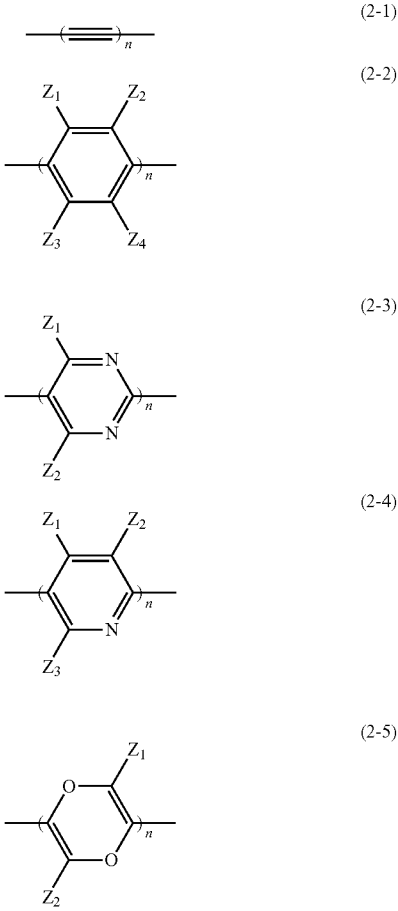

2. An electrode covering material comprising:
organic molecules represented by the Chemical Formula (1), wherein a functional group Y in the Chemical Formula (1) binds to a surface of an electrode made of a metal, and at least one member selected from the group consisting of a nitrogen atom, a functional group $R_1$ and a functional group $R_2$ in the Chemical Formula (1) binds to a metal ion to form a chelate -continued
(2-7)
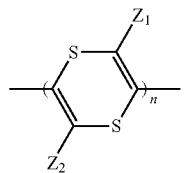
(2-8)
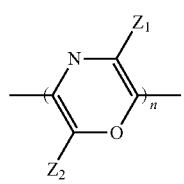
(2-9)
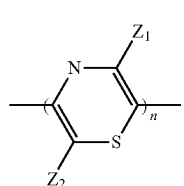
(2-10)
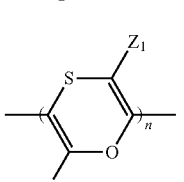
[Chemical Formulas (3-1) to (3-12)]
(3-1) 
(3-2) 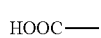
(3-3) 
(3-4) 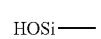
(3-5) 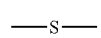
(3-6) 
(3-7) 
(3-8) 
(3-9) 
(3-10)
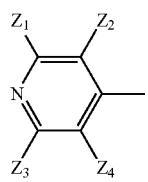
(3-11)
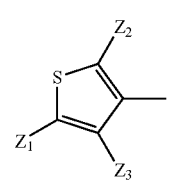
(3-12)
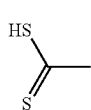
-continued
[Chemical Formulas (4-1) to (4-19)]
(4-1)
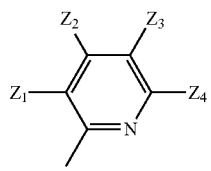
(4-2)
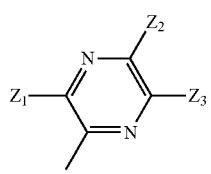
(4-3)
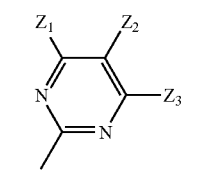
(4-4)
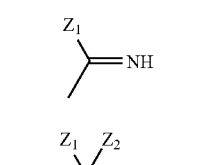
(4-5)
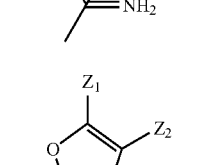
(4-6)
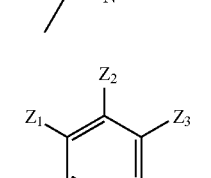
(4-7)
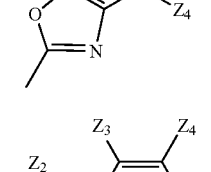
(4-8)
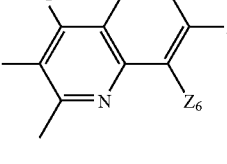
(4-9)
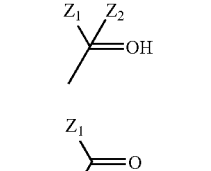
(4-10)
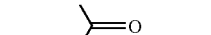

-continued (4-11) 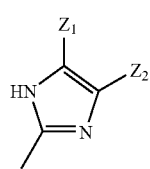

(4-12) 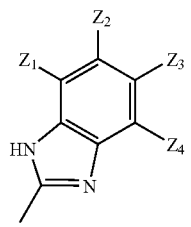

(4-13) 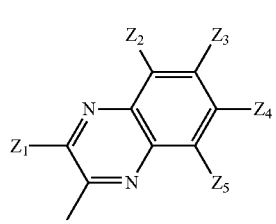

(4-14) 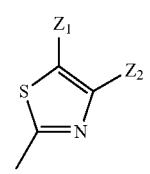

(4-15) 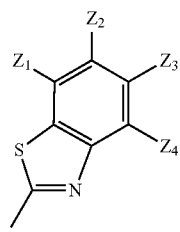

(4-16) 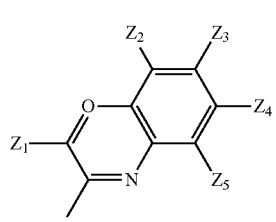

(4-17) 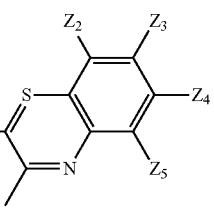

(4-18) 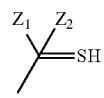

(4-19) 

-continued
[Chemical Formulas (5-1) to (5-18)]

—H  (5-1)

—F  (5-2)

—Cl  (5-3)

—Br  (5-4)

—I  (5-5)

—$CH_3$  (5-6)

—$(CH_2)_m CH_3$  (5-7)

—$OCH_3$  (5-8)

—$O(CH_2)_m CH_3$  (5-9)

—COOH  (5-10)

—(C=O)H  (5-11)

—(C=O)$CH_3$  (5-12)

—(C=O)$(CH_2)_m CH_3$  (5-13)

—(C=O)$OCH_3$  (5-14)

—(C=O)$O(CH_2)_m CH_3$  (5-15)

—$C_6H_5$  (5-16)

—(C=O)$C_6H_5$  (5-17)

—(C=O)$OC_6H_5$.  (5-18)

3. An electrode covering material comprising:
first organic molecules and second organic molecules, the first organic molecules consisting of organic molecules represented by the Chemical Formula (1), the second organic molecules consisting of organic molecules represented by the Chemical Formula (6), wherein a functional group Y in the Chemical Formula (1) binds to a surface of an electrode made of a metal, at least one member selected from the group consisting of a nitrogen atom, a functional group $R_1$ and a functional group $R_2$ in the Chemical Formula (1) binds to a metal ion to form a chelate, at least one member selected from the group consisting of a functional group $R'_1$, a functional group $R'_2$ and a nitrogen atom adjacent to the functional group $R'_1$ in the Chemical Formula (6) binds to a metal ion to form a chelate, and/or at least one member selected from the group consisting of a functional group $R'_3$, a functional group $R'_4$ and a nitrogen atom adjacent to the functional group $R'_3$ in the Chemical Formula (6) binds to a metal ion to form a chelate

[Chemical Formulas (1) and (6)]

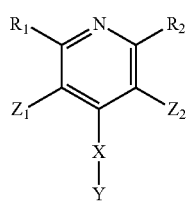

(1)

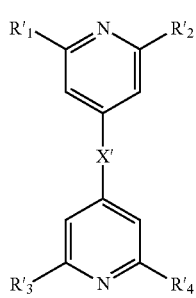

(6)

wherein X in the Chemical Formula (1) is any of the Chemical Formulas (2-1) to (2-10), Y in the Chemical Formula (1) is any of the following Chemical Formulas (3-1) to (3-12), $R_1$ and $R_2$ in the Chemical Formula (1) are, respectively, any of the following Chemical Formulas (4-1) to (4-19), $Z_1$, $Z_2$, $Z_3$, $Z_4$, $Z_5$ and $Z_6$ are, respectively, any of the following Chemical Formulas (5-1) to (5-18), X' in the Chemical Formula (6) is any of the following Chemical Formulas (7-1) to (7-13), $R'_1$, $R'_2$, $R'_3$ and $R'_4$ are, respectively, any of the following Chemical Formulas (8-1) to (8-19), $Z'_1$, $Z'_2$, $Z'_3$, $Z'_4$, $Z'_5$ and $Z'_6$ are, respectively, any of the following Chemical Formulas (9-1) to (9-18), and n and m are integers of 1 or over

[Chemical Formulas (2-1) to (2-10)]

(2-1)

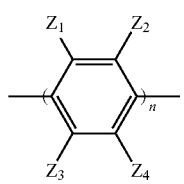

(2-2)

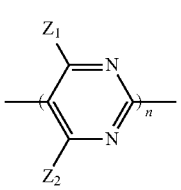

(2-3)

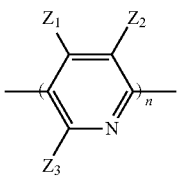

(2-4)

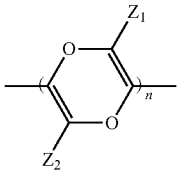

(2-5)

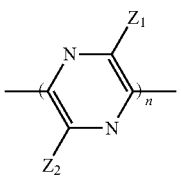

(2-6)

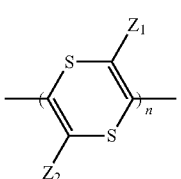

(2-7)

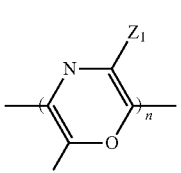

(2-8)

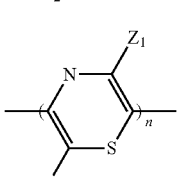

(2-9)

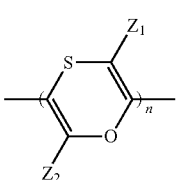

(2-10)

[Chemical Formulas (3-1) to (3-12)]

HS— (3-1)

HOOC— (3-2)

$H_2N$— (3-3)

-continued
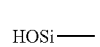 (3-4)
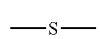 (3-5)
 (3-6)
 (3-7)
 (3-8)
 (3-9)
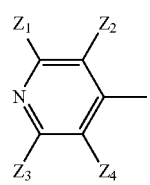 (3-10)
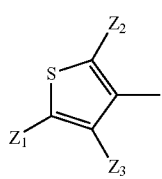 (3-11)
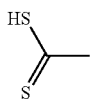 (3-12)
[Chemical Formulas (4-1) to (4-19)]
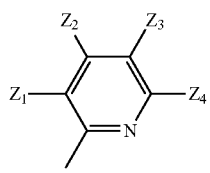 (4-1)
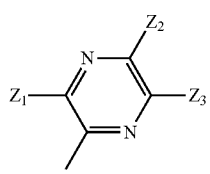 (4-2)
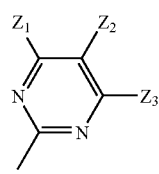 (4-3)
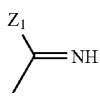 (4-4)
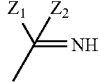 (4-5)
-continued
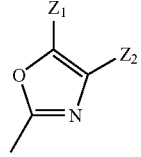 (4-6)
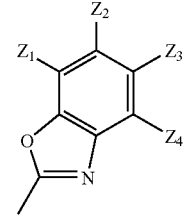 (4-7)
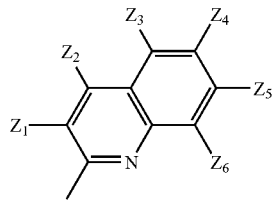 (4-8)
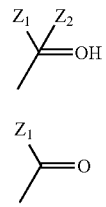 (4-9)
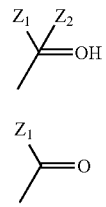 (4-10)
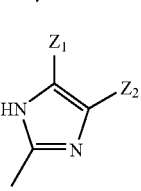 (4-11)
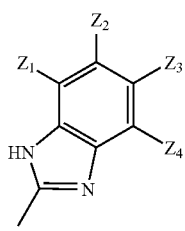 (4-12)
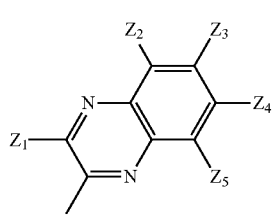 (4-13)
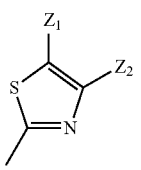 (4-14)

-continued
(4-15)
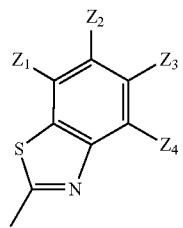
(4-16)
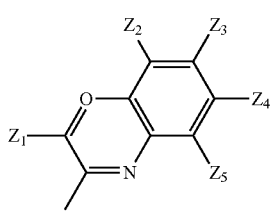
(4-17)
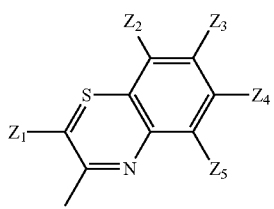
(4-18)
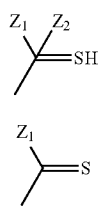
(4-19)
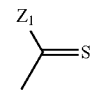
[Chemical Formulas (5-1) to (5-18)]
(5-1) —H
(5-2) —F
(5-3) —Cl
(5-4) —Br
(5-5) —I
(5-6) —CH$_3$
(5-7) —(CH$_2$)$_m$CH$_3$
(5-8) —OCH$_3$
(5-9) —O(CH$_2$)$_m$CH$_3$
(5-10) —COOH
(5-11) —(C═O)H
(5-12) —(C═O)CH$_3$
(5-13) —(C═O)(CH$_2$)$_m$CH$_3$
(5-14) —(C═O)OCH$_3$
(5-15) —(C═O)O(CH$_2$)$_m$CH$_3$
(5-16) —C$_6$H$_5$
(5-17) —(C═O)C$_6$H$_5$
(5-18) —(C═O)OC$_6$H$_5$
[Chemical Formulas (7-1) to (7-13)]
(7-1) 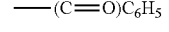
(7-2) 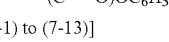
(7-3) 
(7-4) 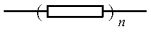 —[Si(Z'$_1$)(Z'$_2$)]$_n$—
(7-5) 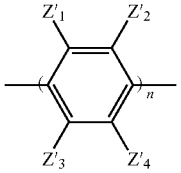
(7-6) 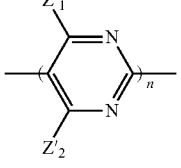
(7-7) 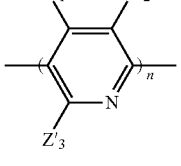
(7-8) 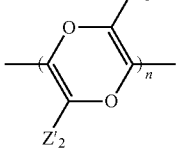
(7-9) 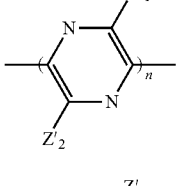
(7-10) 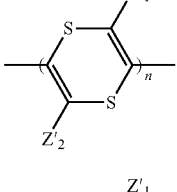
(7-11) 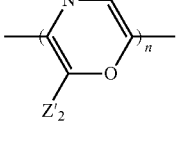

(7-12) 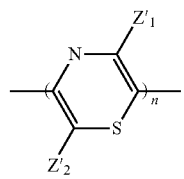
(7-13) 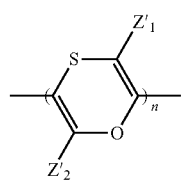
[Chemical Formulas (8-1) to (8-19)]
(8-1) 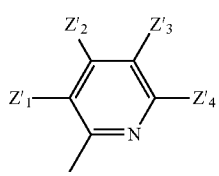
(8-2) 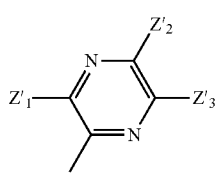
(8-3) 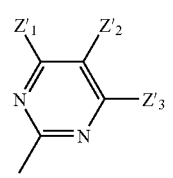
(8-4) 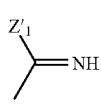
(8-5) 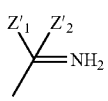
(8-6) 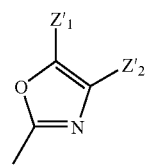
(8-7) 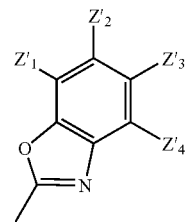
(8-8) 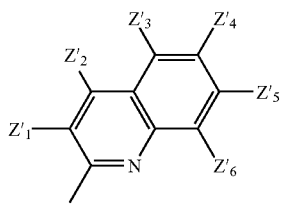
(8-9) 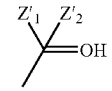
(8-10) 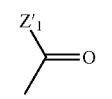
(8-11) 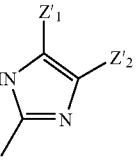
(8-12) 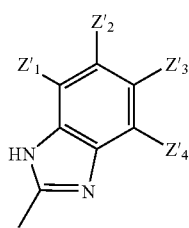
(8-13) 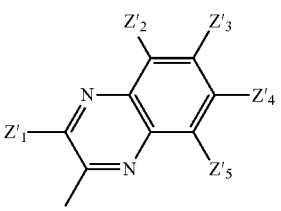
(8-14) 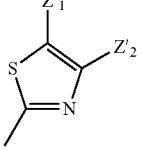
(8-15) 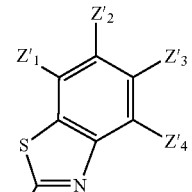
(8-16) 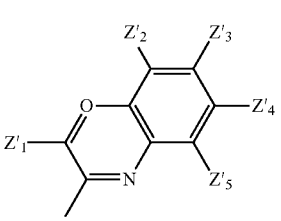

-continued

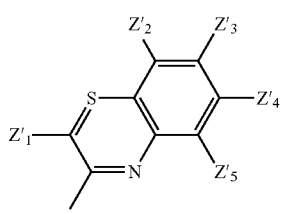
(8-17)

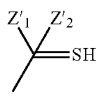
(8-18)

(8-19)

[Chemical Formulas (9-1) to (9-18)]

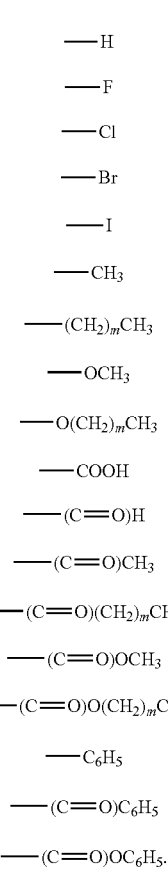

(9-1) —H
(9-2) —F
(9-3) —Cl
(9-4) —Br
(9-5) —I
(9-6) —$CH_3$
(9-7) —$(CH_2)_m CH_3$
(9-8) —$OCH_3$
(9-9) —$O(CH_2)_m CH_3$
(9-10) —COOH
(9-11) —(C=O)H
(9-12) —(C=O)$CH_3$
(9-13) —(C=O)$(CH_2)_m CH_3$
(9-14) —(C=O)$OCH_3$
(9-15) —(C=O)$O(CH_2)_m CH_3$
(9-16) —$C_6H_5$
(9-17) —(C=O)$C_6H_5$
(9-18) —(C=O)$OC_6H_5$.

4. An electrode structure comprising:
an electrode; and
an electrode covering material covering said electrode,
wherein the electrode covering material consists of organic molecules represented by the Chemical Formula (1) and a functional group Y in the Chemical Formula (1) binds to a surface of an electrode made of a metal, and

[Chemical Formula (1)]

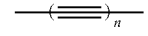
(1)

wherein X in the Chemical Formula (1) is any of the following Chemical Formulas (2-1) to (2-10), Y in the Chemical Formula (1) is any of the following Chemical Formulas (3-1) to (3-12), $R_1$ and $R_2$ in the Chemical Formula (1) are, respectively, any of the following Chemical Formulas (4-1) to (4-19), $Z_1$, $Z_2$, $Z_3$, $Z_4$, $Z_5$ and $Z_6$ are, respectively, any of the following Chemical Formulas (5-1) to (5-18), and n and m are integers of 1 or over

[Chemical Formulas (2-1) to (2-10)]

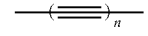
(2-1)

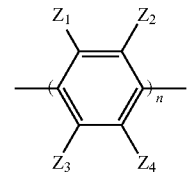
(2-2)

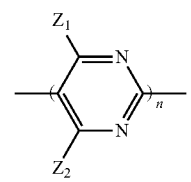
(2-3)

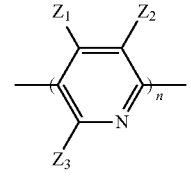
(2-4)

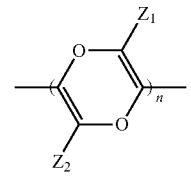
(2-5)

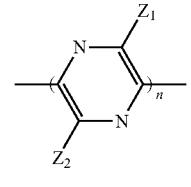
(2-6)

-continued
(2-7) 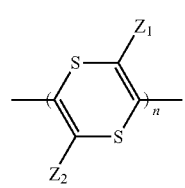
(2-8) 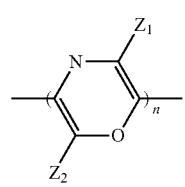
(2-9) 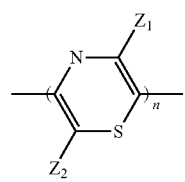
(2-10) 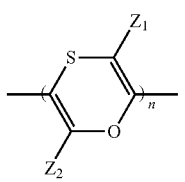
[Chemical Formulas (3-1) to (3-12)]
(3-1) 
(3-2) 
(3-3) 
(3-4) 
(3-5) 
(3-6) 
(3-7) 
(3-8) 
(3-9) 
(3-10) 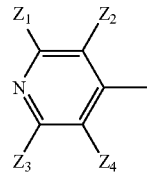
(3-11) 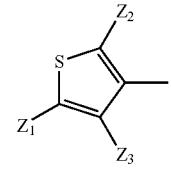
(3-12) 
-continued
[Chemical Formulas (4-1) to (4-19)]
(4-1) 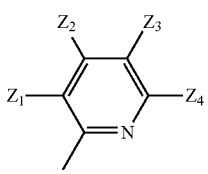
(4-2) 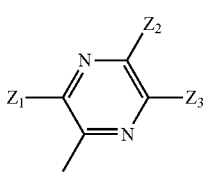
(4-3) 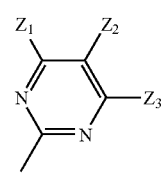
(4-4) 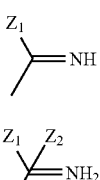
(4-5) 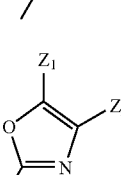
(4-6) 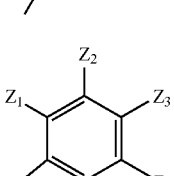
(4-7) 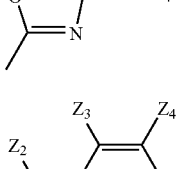
(4-8) 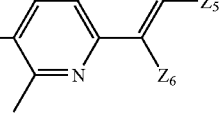
(4-9) 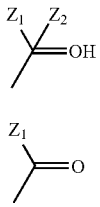
(4-10) 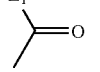

(4-11)
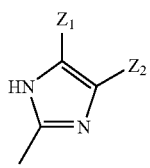

(4-12)
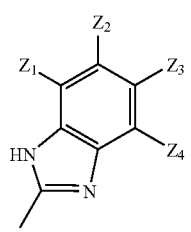

(4-13)
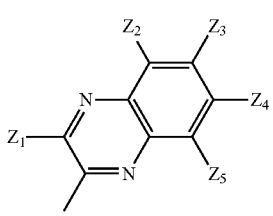

(4-14)
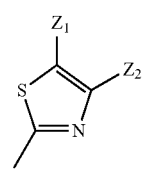

(4-15)
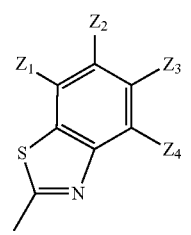

(4-16)
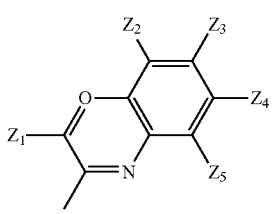

(4-17)
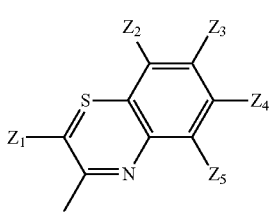

(4-18)
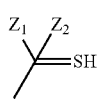

(4-19)

[Chemical Formulas (5-1) to (5-18)]

—H  (5-1)

—F  (5-2)

—Cl  (5-3)

—Br  (5-4)

—I  (5-5)

—$CH_3$  (5-6)

—$(CH_2)_m CH_3$  (5-7)

—$OCH_3$  (5-8)

—$O(CH_2)_m CH_3$  (5-9)

—COOH  (5-10)

—(C=O)H  (5-11)

—(C=O)$CH_3$  (5-12)

—(C=O)$(CH_2)_m CH_3$  (5-13)

—(C=O)$OCH_3$  (5-14)

—(C=O)$O(CH_2)_m CH_3$  (5-15)

—$C_6H_5$  (5-16)

—(C=O)$C_6H_5$  (5-17)

—(C=O)$OC_6H_5$.  (5-18)

5. An electrode structure comprising:
an electrode; and
an electrode covering material covering a surface of said electrode,
wherein the electrode covering material consists of organic molecules represented by the Chemical Formula (1) wherein a functional group Y in the Chemical Formula (1) binds to a surface of an electrode made of a metal, and at least one member selected from the group consisting of a nitrogen atom, a functional group $R_1$ and a functional group $R_2$ in the Chemical Formula (1) binds to a metal ion to form a chelate, and

[Chemical Formula (1)]

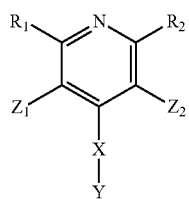

(1)

wherein X in the Chemical Formula (1) is any of the following Chemical Formulas (2-1) to (2-10), Y in the Chemical Formula (1) is any of the following Chemical Formulas (3-1) to (3-12), $R_1$ and $R_2$ in the Chemical Formula (1) are, respectively, any of the following Chemical Formulas (4-1) to (4-19), $Z_1$, $Z_2$, $Z_3$, $Z_4$, $Z_5$ and $Z_6$ are, respectively, any of the following Chemical Formulas (5-1) to (5-18), and n and m are integers of 1 or over

[Chemical Formulas (2-1) to (2-10)]

(2-1)

—(≡)ₙ—

(2-2)

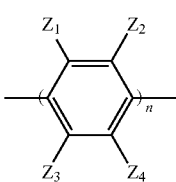

(2-3)

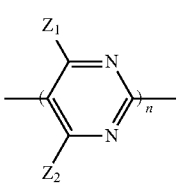

(2-4)

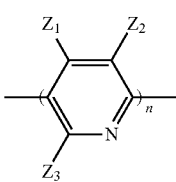

(2-5)

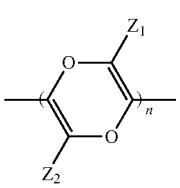

(2-6)

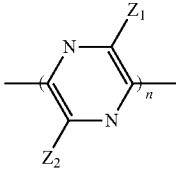

(2-7)

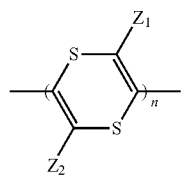

(2-8)

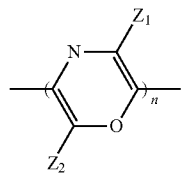

(2-9)

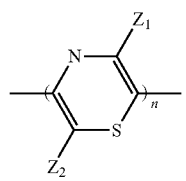

(2-10)

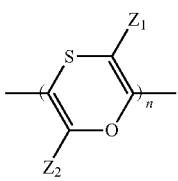

[Chemical Formulas (3-1) to (3-12)]

(3-1) HS—

(3-2) HOOC—

(3-3) H₂N—

(3-4) HOSi—

(3-5) —S—

(3-6) NC—

(3-7) OCN—

(3-8) NCS—

(3-9) HO—

(3-10)

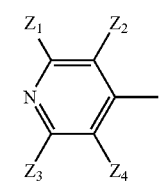

(3-11)

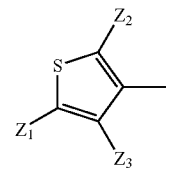

(3-12)

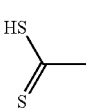

-continued
[Chemical Formulas (4-1) to (4-19)]
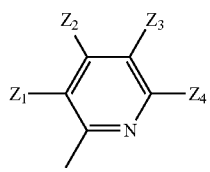 (4-1)
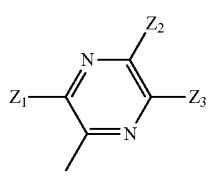 (4-2)
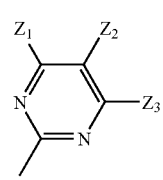 (4-3)
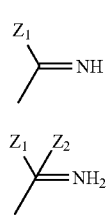 (4-4)
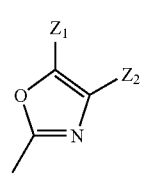 (4-5)
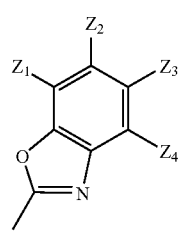 (4-6)
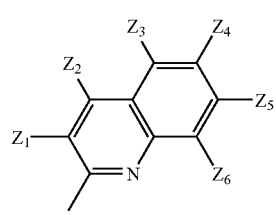 (4-7)
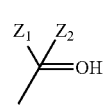 (4-8)
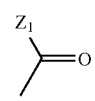 (4-9)
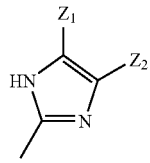 (4-10)
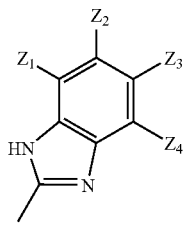 (4-11)
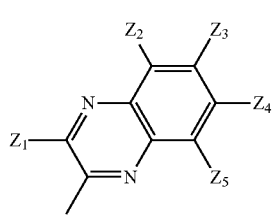 (4-12)
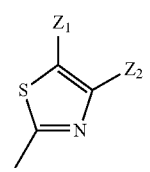 (4-13)
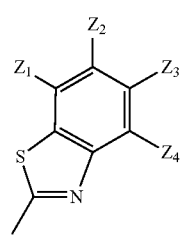 (4-14)
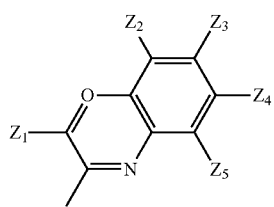 (4-15)
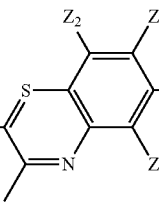 (4-16)
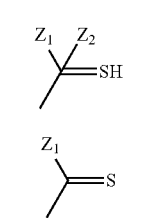 (4-17)

-continued

[Chemical Formulas (5-1) to (5-18)]

—H (5-1)

—F (5-2)

—Cl (5-3)

—Br (5-4)

—I (5-5)

—CH₃ (5-6)

—(CH₂)ₘCH₃ (5-7)

—OCH₃ (5-8)

—O(CH₂)ₘCH₃ (5-9)

—COOH (5-10)

—(C=O)H (5-11)

—(C=O)CH₃ (5-12)

—(C=O)(CH₂)ₘCH₃ (5-13)

—(C=O)OCH₃ (5-14)

—(C=O)O(CH₂)ₘCH₃ (5-15)

—C₆H₅ (5-16)

—(C=O)C₆H₅ (5-17)

—(C=O)OC₆H₅. (5-18)

6. An electrode structure comprising:

an electrode; and an electrode covering material covering a surface of the electrode, wherein the electrode covering material consists of first organic molecules and second organic molecules, the first organic molecules consisting of organic molecules represented by the Chemical Formula (1), the second organic molecules consisting of organic molecules represented by the Chemical Formula (6), in which a functional group Y in the Chemical Formula (1) binds to a surface of an electrode made of a metal, at least one member selected from a nitrogen atom, a functional group R₁ and a functional group R₂ in the Chemical Formula (1) binds to a metal ion to form a chelate, at least one member selected from the group consisting of a functional group R'₁, a functional group R'₂ and a nitrogen atom adjacent to the functional group R'₁ in the Chemical Formula (6) binds to a metal ion to form a chelate, and/or at least one member selected from the group consisting of a functional group R'₃, a functional group R'₄ and a nitrogen atom adjacent to the functional group R'₃ in the Chemical Formula (6) binds to a metal ion to form a chelate, and

[Chemical Formula (1) and (6)]

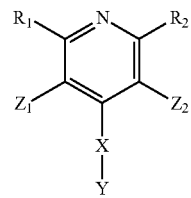
(1)

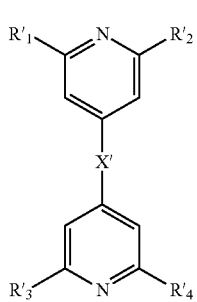
(6)

wherein X in the Chemical Formula (1) is any of the Chemical Formulas (2-1) to (2-10), Y in the Chemical Formula (1) is any of the following Chemical Formulas (3-1) to (3-12), R₁ and R₂ in the Chemical Formula (1) are, respectively, any of the following Chemical Formulas (4-1) to (4-19), Z₁, Z₂, Z₃, Z₄, Z₅ and Z₆ are, respectively, any of the following Chemical Formulas (5-1) to (5-18), X' in the Chemical Formula (6) is any of the following Chemical Formulas (7-1) to (7-13), R'₁, R'₂, R'₃ and R'₄ in Chemical Formula (6) are, respectively, any of the following Chemical Formulas (8-1) to (8-19), Z'₁, Z'₂, Z'₃, Z'₄, Z'₅ and Z'₆ are, respectively, any of the following Chemical Formulas (9-1) to (9-18), and n and m are integers of 1 or over

[Chemical Formulas (2-1) to (2-10)]

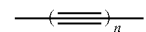
(2-1)

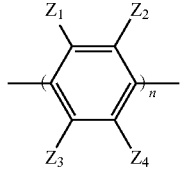
(2-2)

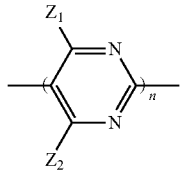
(2-3)

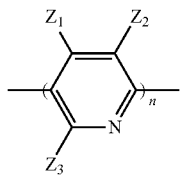
(2-4)

(2-5)
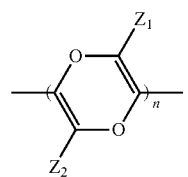
(2-6)
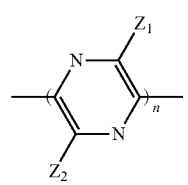
(2-7)
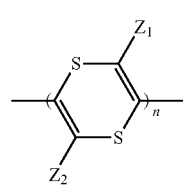
(2-8)
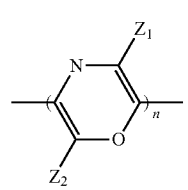
(2-9)
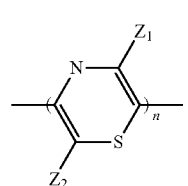
(2-10)
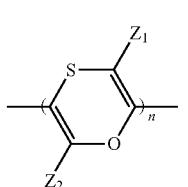
[Chemical Formulas (3-1) to (3-12)]
(3-1) HS—
(3-2) HOOC—
(3-3) $H_2N$—
(3-4) HOSi—
(3-5) —S—
(3-6) NC—
(3-7) OCN—
(3-8) NCS—
(3-9) HO—
(3-10)
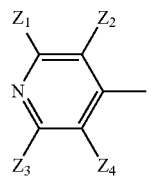
(3-11)
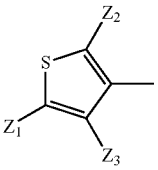
(3-12)
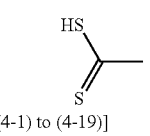
[Chemical Formulas (4-1) to (4-19)]
(4-1)
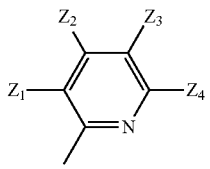
(4-2)
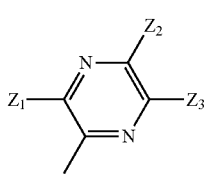
(4-3)
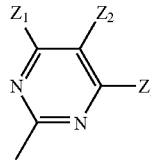
(4-4)
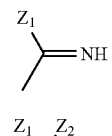
(4-5)
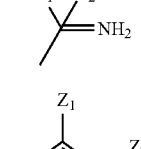
(4-6)
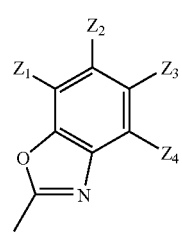
(4-7)

(4-8)
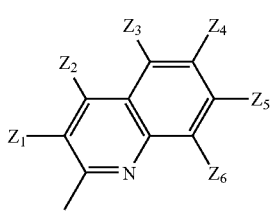
(4-9)
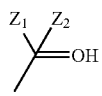
(4-10)
(4-11)
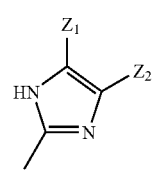
(4-12)
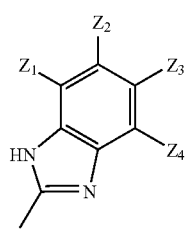
(4-13)
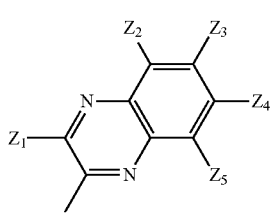
(4-14)
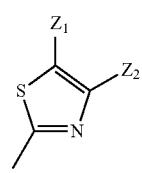
(4-15)
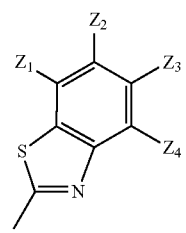
(4-16)
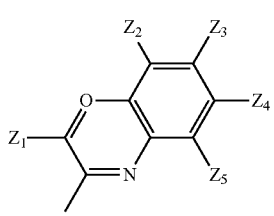
(4-17)
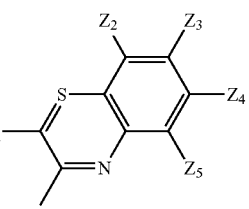
(4-18)
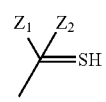
(4-19)
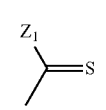
[Chemical Formulas (5-1) to (5-18)]
—H  (5-1)
—F  (5-2)
—Cl  (5-3)
—Br  (5-4)
—I  (5-5)
—$CH_3$  (5-6)
—$(CH_2)_m CH_3$  (5-7)
—$OCH_3$  (5-8)
—$O(CH_2)_m CH_3$  (5-9)
—COOH  (5-10)
—(C=O)H  (5-11)
—(C=O)$CH_3$  (5-12)
—(C=O)$(CH_2)_m CH_3$  (5-13)
—(C=O)$OCH_3$  (5-14)
—(C=O)O$(CH_2)_m CH_3$  (5-15)
—$C_6H_5$  (5-16)
—(C=O)$C_6H_5$  (5-17)
—(C=O)O$C_6H_5$  (5-18)
[Chemical Formulas (7-1) to (7-13)]
—(≡)$_n$—  (7-1)
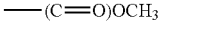  (7-2)
—S—S—  (7-3)
—[Si(Z'$_1$)(Z'$_2$)]$_n$—  (7-4)

(7-5) 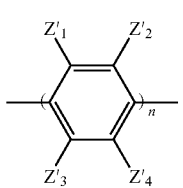
(7-6) 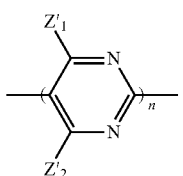
(7-7) 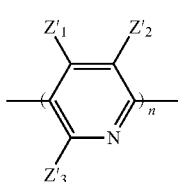
(7-8) 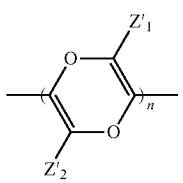
(7-9) 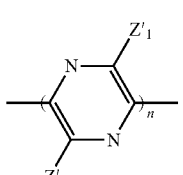
(7-10) 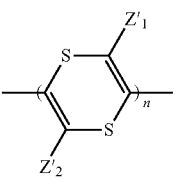
(7-11) 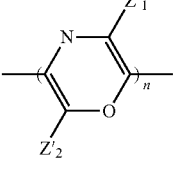
(7-12) 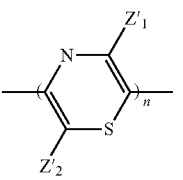
(7-13) 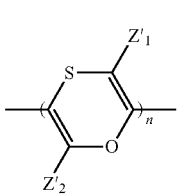
[Chemical Formulas (8-1) to (8-19)]
(8-1) 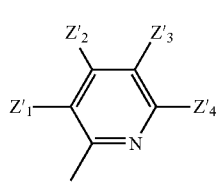
(8-2) 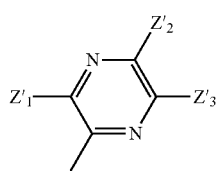
(8-3) 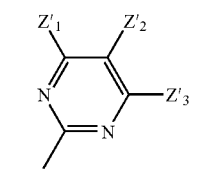
(8-4) 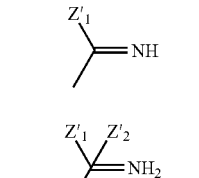
(8-5) 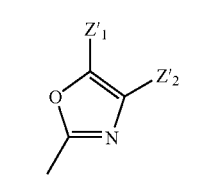
(8-6) 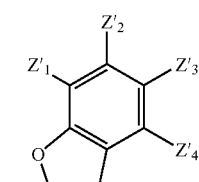
(8-7) 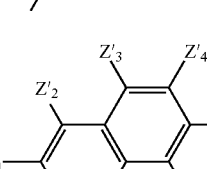
(8-8) 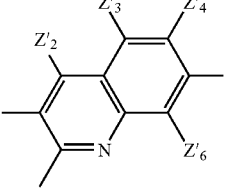

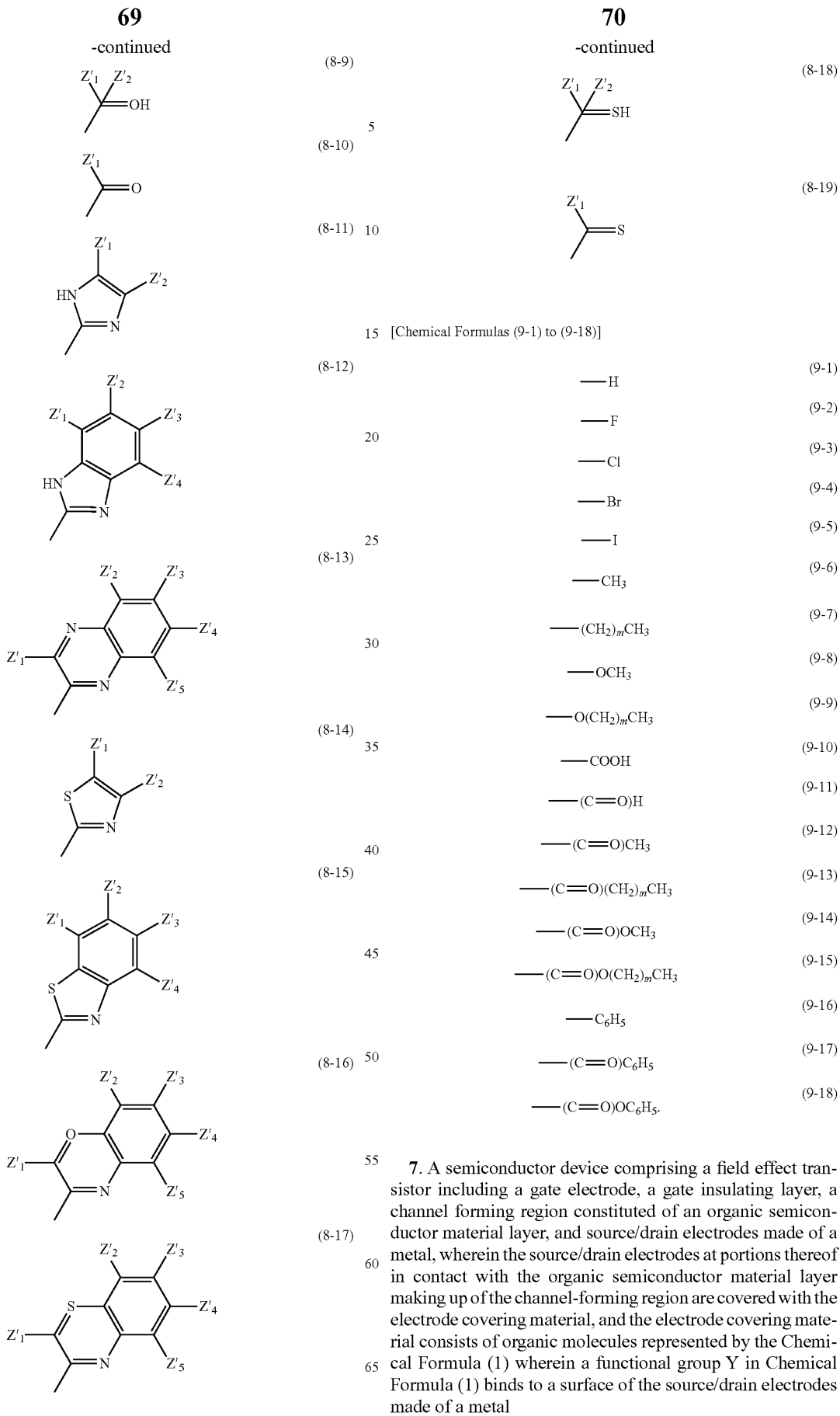

7. A semiconductor device comprising a field effect transistor including a gate electrode, a gate insulating layer, a channel forming region constituted of an organic semiconductor material layer, and source/drain electrodes made of a metal, wherein the source/drain electrodes at portions thereof in contact with the organic semiconductor material layer making up of the channel-forming region are covered with the electrode covering material, and the electrode covering material consists of organic molecules represented by the Chemical Formula (1) wherein a functional group Y in Chemical Formula (1) binds to a surface of the source/drain electrodes made of a metal

[Chemical Formula (1)]

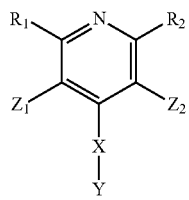
(1)

wherein X in the Chemical Formula (1) is any of the following Chemical Formulas (2-1) to (2-10), Y in the Chemical Formula (1) is any of the following Chemical Formulas (3-1) to (3-12), $R_1$ and $R_2$ in the Chemical Formula (1) are, respectively, any of the following Chemical Formulas (4-1) to (4-19), $Z_1$, $Z_2$, $Z_3$, $Z_4$, $Z_5$ and $Z_6$ are, respectively, any of the following Chemical Formulas (5-1) to (5-18), and n and m are integers of 1 or over

[Chemical Formulas (2-1) to (2-10)]

——(≡)$_n$——  (2-1)

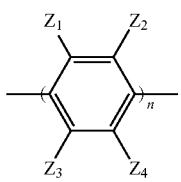
(2-2)

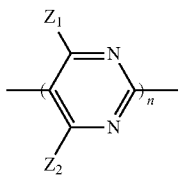
(2-3)

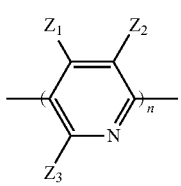
(2-4)

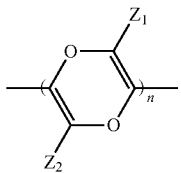
(2-5)

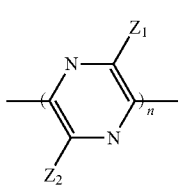
(2-6)

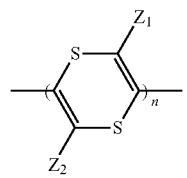
(2-7)

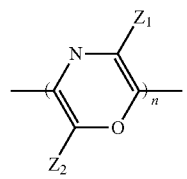
(2-8)

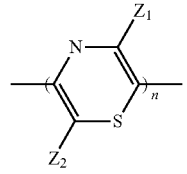
(2-9)

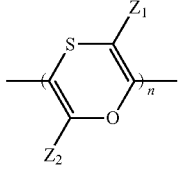
(2-10)

[Chemical Formulas (3-1) to (3-12)]

HS—— (3-1)

HOOC—— (3-2)

$H_2N$—— (3-3)

HOSi—— (3-4)

——S—— (3-5)

NC—— (3-6)

OCN—— (3-7)

NCS—— (3-8)

HO—— (3-9)

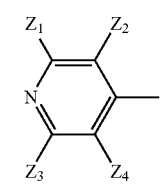
(3-10)

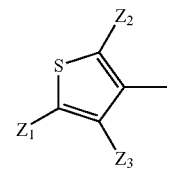
(3-11)

(3-12)

[Chemical Formulas (4-1) to (4-19)]
(4-1) 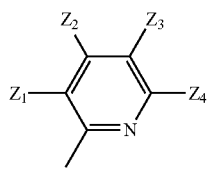
(4-2) 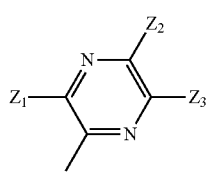
(4-3) 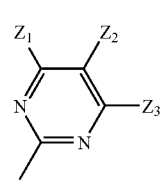
(4-4) 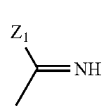
(4-5) 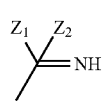
(4-6) 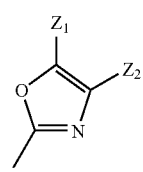
(4-7) 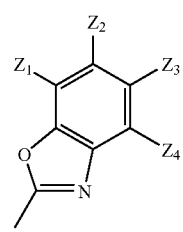
(4-8) 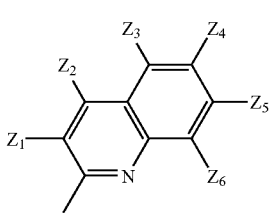
(4-9) 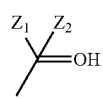
(4-10) 
(4-11) 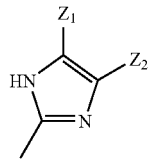
(4-12) 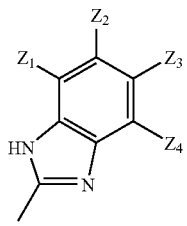
(4-13) 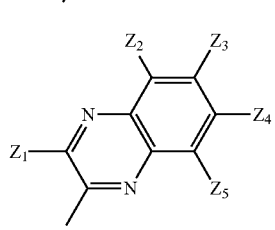
(4-14) 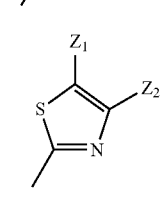
(4-15) 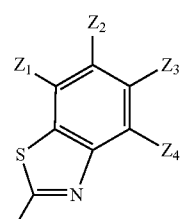
(4-16) 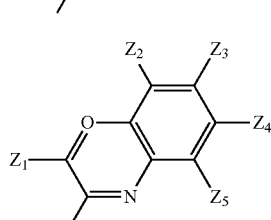
(4-17) 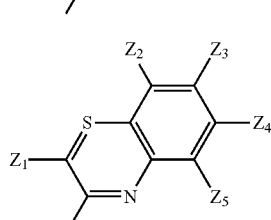
(4-18) 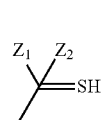
(4-19) 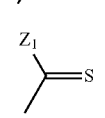

-continued

[Chemical Formulas (5-1) to (5-18)]

—H (5-1)

—F (5-2)

—Cl (5-3)

—Br (5-4)

—I (5-5)

—CH$_3$ (5-6)

—(CH$_2$)$_m$CH$_3$ (5-7)

—OCH$_3$ (5-8)

—O(CH$_2$)$_m$CH$_3$ (5-9)

—COOH (5-10)

—(C=O)H (5-11)

—(C=O)CH$_3$ (5-12)

—(C=O)(CH$_2$)$_m$CH$_3$ (5-13)

—(C=O)OCH$_3$ (5-14)

—(C=O)O(CH$_2$)$_m$CH$_3$ (5-15)

—C$_6$H$_5$ (5-16)

—(C=O)C$_6$H$_5$ (5-17)

—(C=O)OC$_6$H$_5$. (5-18)

8. A semiconductor device comprising:
a field effect transistor including a gate electrode, a gate insulating layer, a channel forming region constituted of an organic semiconductor material layer, and source/drain electrode made of a metal,
wherein the source/drain electrodes at portions thereof in contact with the organic semiconductor material layer making up of the channel-forming region are covered with the electrode covering material, and the electrode covering material consists of organic molecules represented by the Chemical Formula (1) wherein a functional group Y in Chemical Formula (1) binds to a surface of the source/drain electrodes made of a metal and at least one member selected from a nitrogen atom, a functional group R$_1$ and a functional group R$_2$ in the Chemical Formula (1) binds to a metal ion to form a chelate, and

[Chemical Formula (1)]

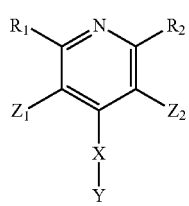

(1)

wherein X in the Chemical Formula (1) is any of the following Chemical Formulas (2-1) to (2-10), Y in the Chemical Formula (1) is any of the following Chemical Formulas (3-1) to (3-12), R$_1$ and R$_2$ in the Chemical Formula (1) are, respectively, any of the following Chemical Formulas (4-1) to (4-19), Z$_1$, Z$_2$, Z$_3$, Z$_4$, Z$_5$ and Z$_6$ are, respectively, any of the following Chemical Formulas (5-1) to (5-18), and n and m are integers of 1 or over

[Chemical Formulas (2-1) to (2-10)]

 (2-1)

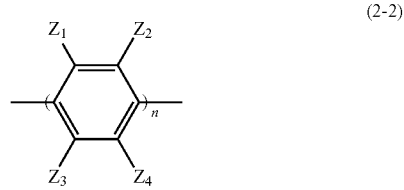 (2-2)

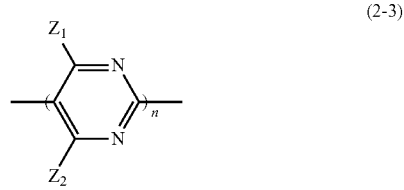 (2-3)

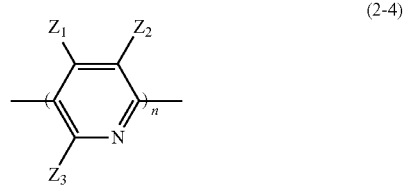 (2-4)

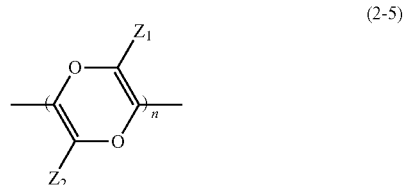 (2-5)

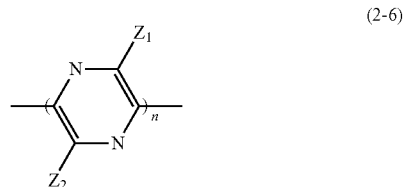 (2-6)

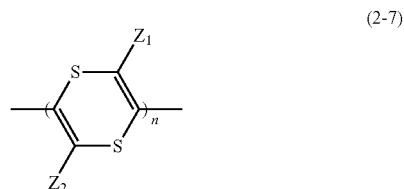 (2-7)

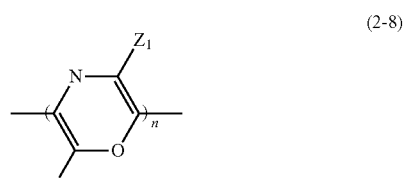 (2-8)

(2-9)
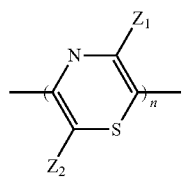
(2-10)
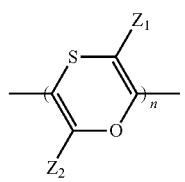
[Chemical Formulas (3-1) to (3-12)]
HS— (3-1)
HOOC— (3-2)
H₂N— (3-3)
HOSi— (3-4)
—S— (3-5)
NC— (3-6)
OCN— (3-7)
NCS— (3-8)
HO— (3-9)
(3-10)
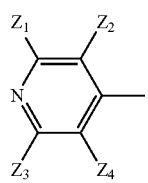
(3-11)
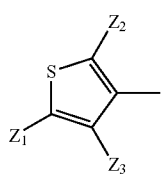
(3-12)
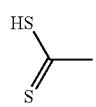
[Chemical Formulas (4-1) to (4-19)]
(4-1)
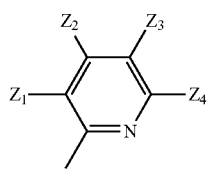
(4-2)
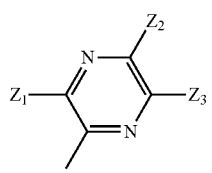
(4-3)
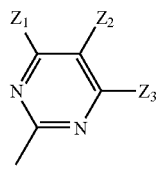
(4-4)
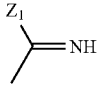
(4-5)
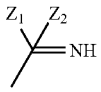
(4-6)
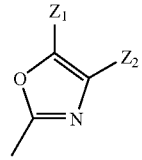
(4-7)
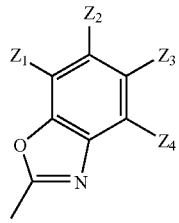
(4-8)
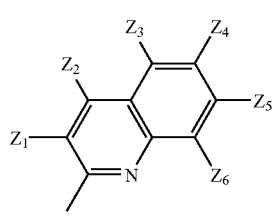
(4-9)
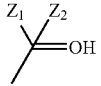
(4-10)
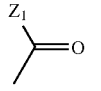
(4-11)
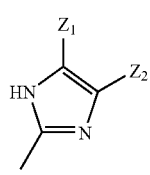

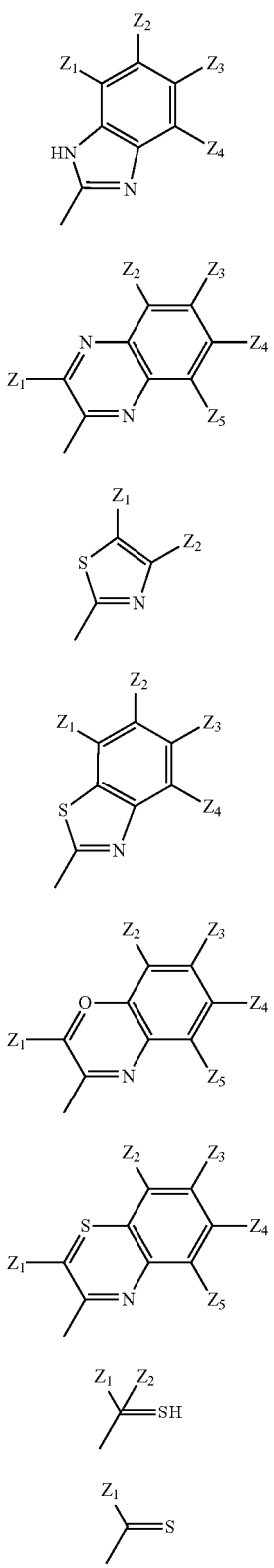

[Chemical Formulas (5-1) to (5-18)]

(5-1) —H
(5-2) —F
(5-3) —Cl
(5-4) —Br
(5-5) —I
(5-6) —CH$_3$
(5-7) —(CH$_2$)$_m$CH$_3$
(5-8) —OCH$_3$
(5-9) —O(CH$_2$)$_m$CH$_3$
(5-10) —COOH
(5-11) —(C=O)H
(5-12) —(C=O)CH$_3$
(5-13) —(C=O)(CH$_2$)$_m$CH$_3$
(5-14) —(C=O)OCH$_3$
(5-15) —(C=O)O(CH$_2$)$_m$CH$_3$
(5-16) —C$_6$H$_5$
(5-17) —(C=O)C$_6$H$_5$
(5-18) —(C=O)OC$_6$H$_5$.

9. A semiconductor device comprising: a field effect transistor including a gate electrode, a gate insulating layer, a channel forming region comprising:

an organic semiconductor material layer, and a source/drain electrode made of a metal, wherein the source/drain electrodes at portions thereof in contact with the organic semiconductor material layer making up the channel-forming region are covered with an electrode covering material, and the electrode covering material consists of first organic molecules and second organic molecules, the first organic molecules consisting of organic molecules represented by the Chemical Formula (1), the second organic molecules consisting of organic molecules represented by the Chemical Formula (6), in which a functional group Y in the Chemical Formula (1) binds to a surface of the source/drain electrodes made of a metal, at least one member selected from a nitrogen atom, a functional group R$_1$ and a functional group R$_2$ in the Chemical Formula (1) binds to a metal ion to form a chelate, at least one member selected from the group consisting of a functional group R'$_1$, a functional group R'$_2$ and a nitrogen atom adjacent to the functional group R'$_1$ in the Chemical Formula (6) binds to a metal ion to form a chelate, and/or at least one member selected from the group consisting of a functional group R'$_3$, a functional group R'$_4$ and a nitrogen atom adjacent to the functional group R'$_3$ in the Chemical Formula (6) binds to a metal ion to form a chelate,

[Chemical Formula (1) and (6)]

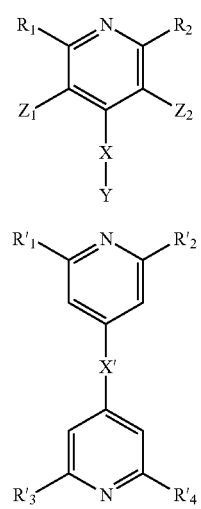

(1)

(6)

wherein X in the Chemical Formula (1) is any of the Chemical Formulas (2-1) to (2-10), Y in the Chemical Formula (1) is any of the following Chemical Formulas (3-1) to (3-12), $R_1$ and $R_2$ in the Chemical Formula (1) are, respectively, any of the following Chemical Formulas (4-1) to (4-19), $Z_1, Z_2, Z_3, Z_4, Z_5$ and $Z_6$ are, respectively, any of the following Chemical Formulas (5-1) to (5-18), X' in the Chemical Formula (6) is any of the following Chemical Formulas (7-1) to (7-13), $R'_1, R'_2, R'_3$ and $R'_4$ in Chemical Formula (6) are, respectively, any of the following Chemical Formulas (8-1) to (8-19), $Z'_1, Z'_2, Z'_3, Z'_4, Z'_5$ and $Z'_6$ are, respectively, any of the following Chemical Formulas (9-1) to (9-18), and n and m are integers of 1 or over

[Chemical Formulas (2-1) to (2-10)]

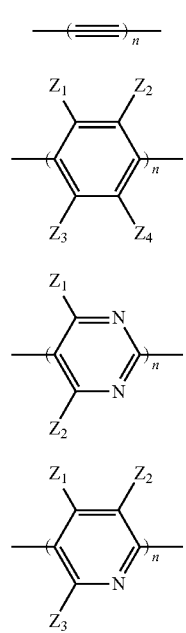

(2-1)

(2-2)

(2-3)

(2-4)

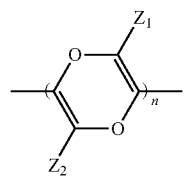

(2-5)

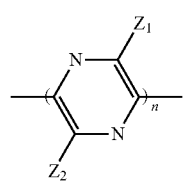

(2-6)

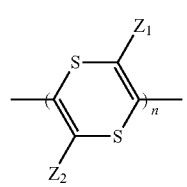

(2-7)

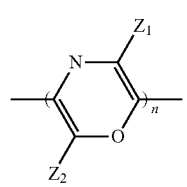

(2-8)

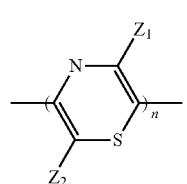

(2-9)

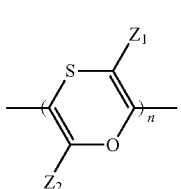

(2-10)

[Chemical Formulas (3-1) to (3-12)]

HS— (3-1)

HOOC— (3-2)

$H_2N$— (3-3)

HOSi— (3-4)

—S— (3-5)

NC— (3-6)

OCN— (3-7)

NCS— (3-8)

HO— (3-9)

(3-10) 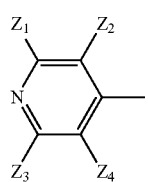
(3-11) 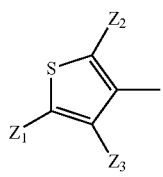
(3-12) 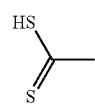
[Chemical Formulas (4-1) to (4-19)]
(4-1) 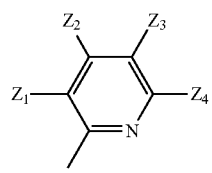
(4-2) 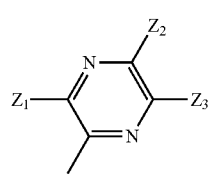
(4-3) 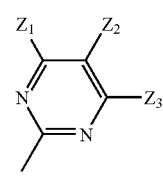
(4-4) 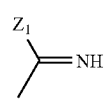
(4-5) 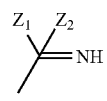
(4-6) 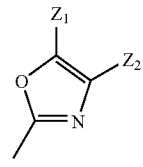
(4-7) 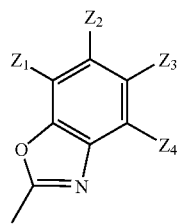
(4-8) 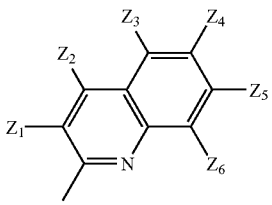
(4-9) 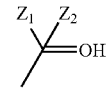
(4-10) 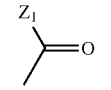
(4-11) 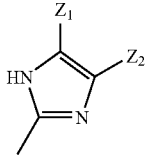
(4-12) 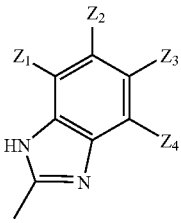
(4-13) 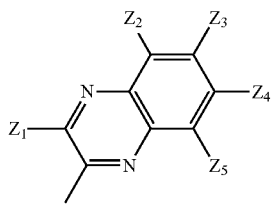
(4-14) 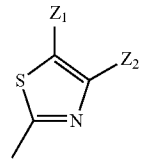
(4-15) 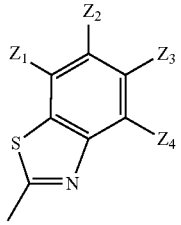
(4-16) 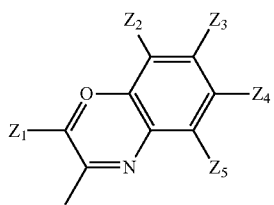

85
-continued
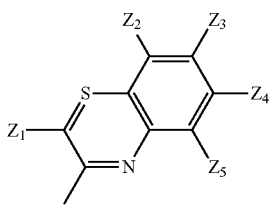
(4-17)
(4-18)
(4-19)
[Chemical Formulas (5-1) to (5-18)]
—H  (5-1)
—F  (5-2)
—Cl  (5-3)
—Br  (5-4)
—I  (5-5)
—$CH_3$  (5-6)
—$(CH_2)_m CH_3$  (5-7)
—$OCH_3$  (5-8)
—$O(CH_2)_m CH_3$  (5-9)
—COOH  (5-10)
—(C=O)H  (5-11)
—(C=O)$CH_3$  (5-12)
—(C=O)$(CH_2)_m CH_3$  (5-13)
—(C=O)$OCH_3$  (5-14)
—(C=O)O$(CH_2)_m CH_3$  (5-15)
—$C_6H_5$  (5-16)
—(C=O)$C_6H_5$  (5-17)
—(C=O)O$C_6H_5$  (5-18)
[Chemical Formulas (7-1) to (7-13)]
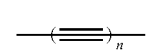
(7-1)
(7-2)
—S—S—  (7-3)
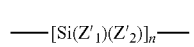
(7-4)
86
-continued
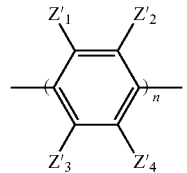
(7-5)
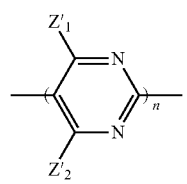
(7-6)
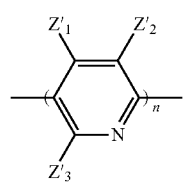
(7-7)
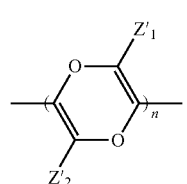
(7-8)
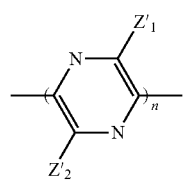
(7-9)
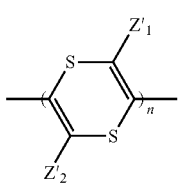
(7-10)
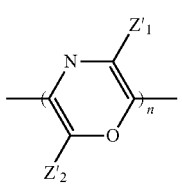
(7-11)
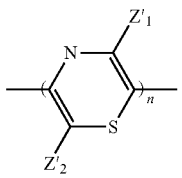
(7-12)

(7-13)
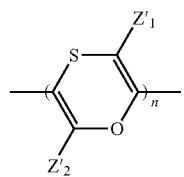
[Chemical Formulas (8-1) to (8-19)]
(8-1)
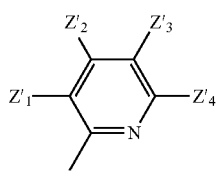
(8-2)
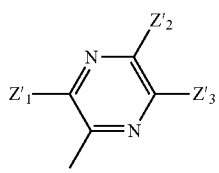
(8-3)
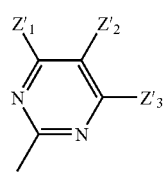
(8-4)
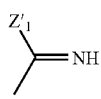
(8-5)
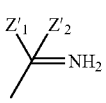
(8-6)
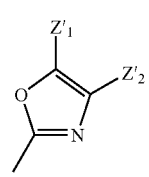
(8-7)
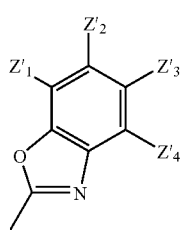
(8-8)
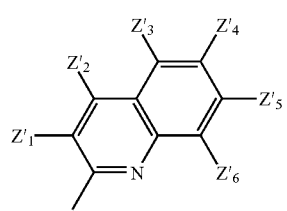
(8-9)
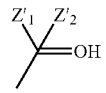
(8-10)
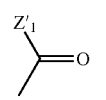
(8-11)
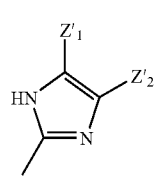
(8-12)
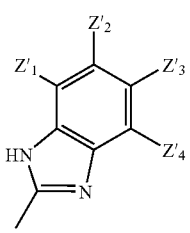
(8-13)
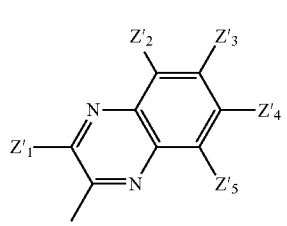
(8-14)
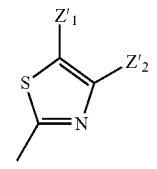
(8-15)
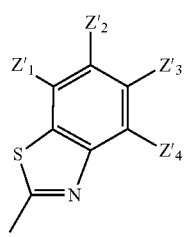
(8-16)
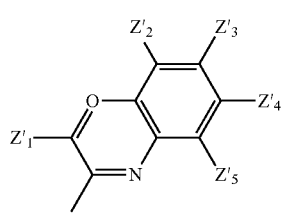

-continued
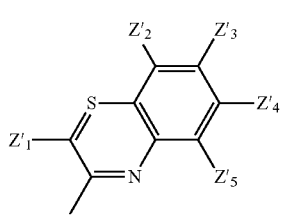 (8-17)
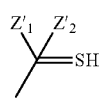 (8-18)
 (8-19)
[Chemical Formulas (9-1) to (9-18)]
—H (9-1)
—F (9-2)
—Cl (9-3)
—Br (9-4)
—I (9-5)
—CH$_3$ (9-6)
—(CH$_2$)$_m$CH$_3$ (9-7)
—OCH$_3$ (9-8)
—O(CH$_2$)$_m$CH$_3$ (9-9)
—COOH (9-10)
—(C═O)H (9-11)
—(C═O)CH$_3$ (9-12)
—(C═O)(CH$_2$)$_m$CH$_3$ (9-13)
—(C═O)OCH$_3$ (9-14)
—(C═O)O(CH$_2$)$_m$CH$_3$ (9-15)
—C$_6$H$_5$ (9-16)
—(C═O)C$_6$H$_5$ (9-17)
—(C═O)OC$_6$H$_5$. (9-18)
* * * * *